United States Patent
Bishop et al.

(10) Patent No.: US 10,920,087 B2
(45) Date of Patent: Feb. 16, 2021

(54) HYDROGENATED ISOTOPICALLY ENRICHED BORONT TRIFLUORIDE DOPANT SOURCE GAS COMPOSITION

(71) Applicant: ENTEGRIS, INC., Billerica, MA (US)

(72) Inventors: Steven Bishop, Danbury, CT (US); Sharad N. Yedave, Danbury, CT (US); Oleg Bly, Danbury, CT (US); Joseph Sweeney, Danbury, CT (US); Ying Tang, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 131 days.

(21) Appl. No.: 16/098,728

(22) PCT Filed: Mar. 27, 2017

(86) PCT No.: PCT/US2017/024312
§ 371 (c)(1),
(2) Date: Nov. 2, 2018

(87) PCT Pub. No.: WO2017/172618
PCT Pub. Date: Oct. 5, 2017

(65) Prior Publication Data
US 2019/0136069 A1    May 9, 2019

Related U.S. Application Data

(60) Provisional application No. 62/314,241, filed on Mar. 28, 2016.

(51) Int. Cl.
*C09D 1/00* (2006.01)
*H01J 37/08* (2006.01)
(Continued)

(52) U.S. Cl.
CPC .............. *C09D 1/00* (2013.01); *C01B 35/061* (2013.01); *H01J 37/08* (2013.01);
(Continued)

(58) Field of Classification Search
CPC ........ C09D 1/00; H01J 37/3171; H01J 37/08; H01J 2237/006
See application file for complete search history.

(56) References Cited

U.S. PATENT DOCUMENTS

| 6,089,027 A | 7/2000 | Wang |
| 6,101,816 A | 8/2000 | Wang |

(Continued)

FOREIGN PATENT DOCUMENTS

| TW | 201035036 A | 10/2010 |
| TW | 201317325 A | 5/2013 |

OTHER PUBLICATIONS tnternationl Search Report for International Application No. PCT/US2017/024312, dated Jun. 28, 2017 (2 pages).

*Primary Examiner* — Wayne A Langel
(74) *Attorney, Agent, or Firm* — Entegris, Inc.

(57) ABSTRACT

A hydrogenated isotopically enriched boron trifluoride (BF3) dopant source gas composition. The composition contains (i) boron trifluoride isotopically enriched above natural abundance in boron of atomic mass 11 (UB), and (ii) hydrogen in an amount of from 2 to 6.99 vol. %, based on total volume of boron trifluoride and hydrogen in the composition. Also described are methods of use of such dopant source gas composition, and associated apparatus therefor.

17 Claims, 13 Drawing Sheets

(51) Int. Cl.
*C01B 35/06* (2006.01)
*H01J 37/317* (2006.01)
*H01J 37/32* (2006.01)

(52) U.S. Cl.
CPC ...... *H01J 37/3171* (2013.01); *H01J 37/3244* (2013.01); *H01J 37/32412* (2013.01); *H01J 2237/006* (2013.01); *H01J 2237/022* (2013.01); *H01J 2237/0206* (2013.01)

(56) References Cited

U.S. PATENT DOCUMENTS

| | | | |
|---|---|---|---|
| 6,343,476 B1 | 2/2002 | Wang | |
| 7,033,879 B2 | 4/2006 | Hornung | |
| 8,237,134 B2 * | 8/2012 | Kaim | F17C 7/00 |
| | | | 250/492.21 |
| 9,548,181 B2 * | 1/2017 | Sinha | H01J 37/32807 |
| 10,090,133 B2 * | 10/2018 | Sinha | H01J 37/3171 |
| 2003/0133963 A1 | 7/2003 | Hubbell | |
| 2008/0248636 A1 * | 10/2008 | Olander | H01L 21/26566 |
| | | | 438/515 |
| 2011/0097882 A1 * | 4/2011 | Kaim | C01B 35/061 |
| | | | 438/513 |
| 2011/0159671 A1 * | 6/2011 | Kaim | C01B 35/061 |
| | | | 438/514 |
| 2012/0108044 A1 * | 5/2012 | Kaim | H01J 37/3171 |
| | | | 438/514 |
| 2012/0119113 A1 * | 5/2012 | Colvin | H01J 37/08 |
| | | | 250/492.3 |
| 2013/0243874 A1 | 9/2013 | Sun | |
| 2015/0248992 A1 | 9/2015 | Sinha et al. | |
| 2019/0027341 A1 * | 1/2019 | Graff | H01J 37/08 |

* cited by examiner

US 10,920,087 B2

HYDROGENATED ISOTOPICALLY ENRICHED BORONT TRIFLUORIDE DOPANT SOURCE GAS COMPOSITION

CROSS-REFERENCE TO RELATED APPLICATIONS

This application claims priority to International Application No. PCT/EP2017/024312, filed Mar. 27, 2017 and titled "HYDROGENATED ISOTOPICALLY ENRICHED BORONT TRIFLUORIDE DOPANT SOURCE GAS COMPOSITION," which in turn claims priority from a Provisional Application having Ser. No. 62/314,241, filed Mar. 28, 2016 and titled "HYDROGENATED ISOTOPICALLY ENRICHED BORONT TRIFLUORIDE DOPANT SOURCE GAS COMPOSITION," both of which are incorporated herein by reference in their entireties.

TECHNICAL FIELD

The disclosure relates to a hydrogenated isotopically enriched boron trifluoride ($BF_3$) dopant source gas composition for use in ion implantation, and to associated methods and apparatus.

BACKGROUND

Ion implantation is used in integrated circuit fabrication to accurately introduce controlled amounts of dopant impurities into semiconductor wafers during the manufacture of microelectronic/semiconductor manufacturing. In such implantation systems, an ion source ionizes a desired dopant element gas, and the ions are extracted from the source in the form of an ion beam of desired energy. Extraction is achieved by applying a high voltage across suitably-shaped extraction electrodes, which incorporate apertures for passage of the extracted beam. The ion beam is then directed at the surface of a workpiece, such as a semiconductor wafer, to implant the dopant elements into the workpiece. The ions of the beam penetrate the surface of the workpiece to form a region of desired conductivity.

Several types of ion sources are used in ion implantation systems, including the Freeman and Bernas types that employ thermoelectrodes and are powered by an electric arc, microwave types using a magnetron, indirectly heated cathode (IHC) sources, and RF plasma sources, all of which typically operate in a vacuum. In any system, the ion source generates ions by introducing electrons into a vacuum arc chamber (hereinafter "chamber") filled with the dopant gas (commonly referred to as the "feedstock gas"). Collisions of the electrons with atoms and molecules in the dopant gas result in the creation of ionized plasma consisting of positive and negative dopant ions. An extraction electrode with a negative or positive bias will respectively allow the positive or negative ions to pass through an aperture as a collimated ion beam, which is accelerated towards the target material.

In many ion implantation operations, boron is implanted in the production of integrated circuit devices. The boron is generally implanted from a feedstock gas such as boron trifluoride.

Tungsten is commonly used as a material of construction for filament elements and other cathode structures in ion implantation systems. A persistent problem in use of such material in the ion source chamber of the ion implantation system is that of tungsten loss, which can result in filament thinning or so-called "punch through" of the cathode structure, requiring re-metallization or replacement of the cathode structure. In extreme cases, sputtering of tungsten from the cathode can result in extremely short operating life of the ion source before such re-metallization or replacement is needed. The loss of tungsten from the cathode is associated with unwanted deposition of tungsten on the ion source chamber surfaces and unwanted tungsten beam contributions to the ion beam generated in the system. The loss of tungsten thus can be a contributor to ion beam instability, and may eventually cause premature failure of the ion source.).

SUMMARY

The present disclosure relates to a hydrogenated isotopically enriched boron trifluoride ($BF_3$) dopant source gas composition for use in ion implantation, and to associated methods and apparatus.

In one aspect, the disclosure relates to a hydrogenated isotopically enriched boron trifluoride ($BF_3$) dopant source gas composition including (i) boron trifluoride isotopically enriched above natural abundance in boron of atomic mass 11 ($^{11}B$), and (ii) hydrogen in an amount of from 2 to 6.99 vol. %, based on total volume of boron trifluoride and hydrogen in said composition.

In another aspect, the disclosure relates to a hydrogenated isotopically enriched boron trifluoride ($BF_3$) dopant source gas composition including (i) boron trifluoride isotopically enriched above 99% in boron of atomic mass 11 ($^{11}B$), and (ii) hydrogen in an amount of 5 vol. %, based on total volume of boron trifluoride and hydrogen in said composition.

In a further aspect, the disclosure relates to a hydrogenated isotopically enriched boron trifluoride ($BF_3$) dopant source gas composition, said composition consisting essentially of (i) boron trifluoride isotopically enriched above natural abundance in boron of atomic mass 11 ($^{11}B$), and (ii) hydrogen in an amount of from 2 to 6.99 vol. %, based on total volume of boron trifluoride and hydrogen in such composition. More particularly, hydrogen may be present in any suitable amount, ranging from 2 to 6.5 vol. %, based on total volume of boron trifluoride and hydrogen in such composition, ranging from 2.5 to 6.25 vol. %, based on total volume of boron trifluoride and hydrogen in such composition, ranging from 3 to 6 vol. %, based on total volume of boron trifluoride and hydrogen in such composition, from about 4 to 6 vol. % or in an amount of 5 vol. %, based on total volume of boron trifluoride and hydrogen in said composition, it being appreciated that the specific amount, or utilized range of such amount, may be selected for specific applications to achieve a desired level of operational performance or enhancement.

A further aspect of the disclosure relates to a boron dopant gas composition supply package including a gas storage and dispensing vessel containing a hydrogenated isotopically enriched boron trifluoride ($BF_3$) dopant source gas composition according to the various embodiments as disclosed herein.

A still further aspect of the disclosure relates to method of forming a boron-implanted substrate, comprising ionizing a hydrogenated isotopically enriched boron trifluoride ($BF_3$) dopant source gas composition according to the various embodiments as disclosed herein, to generate boron-containing ionic implant species, and implanting such boron-containing implant species in the substrate.

A further aspect of the disclosure relates to a method of boron ion implantation, including introducing to an ion source chamber of an ion implantation system a hydrogenated isotopically enriched boron trifluoride (BF$_3$) dopant source gas composition according to the various embodiments disclosed herein, and ionizing such hydrogenated isotopically enriched boron trifluoride (BF$_3$) dopant source gas composition in the ion source chamber to generate boron-containing implant species for the boron ion implantation.

The disclosure relates in a further aspect to a method of enhancing operation of an ion implantation system, including flowing a boron dopant gas composition to an ion implantation system from a boron dopant gas supply package including a gas storage and dispensing vessel holding a hydrogenated isotopically enriched boron trifluoride (BF$_3$) dopant source gas composition according to the various embodiments of the disclosure as described herein.

Another aspect of the disclosure relates to a method of reducing tungsten cathode erosion in a boron ion implantation system having a tungsten cathode, the method including generating boron implant species for boron ion implantation within the system by ionization of a hydrogenated isotopically enriched boron trifluoride (BF$_3$) dopant source gas composition according to the various embodiments of the disclosure as described herein.

Yet another aspect of the disclosure relates to a method of enhancing operational performance of a boron ion implantation system, including supplying for use in the boron ion implantation system a boron dopant source gas composition including a hydrogenated isotopically enriched boron trifluoride (BF$_3$) dopant source gas composition according to the various embodiments of the disclosure as described herein.

In a further aspect, the disclosure relates to a method of enhancing operational performance of a boron ion implantation system, including generating boron implant species in the boron ion implantation system from a boron dopant source gas composition including a hydrogenated isotopically enriched boron trifluoride (BF$_3$) dopant source gas composition according to the various embodiments of the disclosure as described herein.

The disclosure in a further aspect relates to a method of enhancing beam stability and ion source life of a boron doping ion implantation system comprising a cathode, the method including introducing a boron dopant source gas composition to an ion source chamber of the boron doping ion implantation system, operating the boron doping ion implantation system to ionize the boron dopant source gas composition in the ion source chamber and generate a beam of boron dopant species that is directed to a substrate in the ion implantation system for boron doping of the substrate therein with the boron dopant species, wherein the dopant source gas composition includes (i) boron trifluoride isotopically enriched above natural abundance in boron of atomic mass 11 ($^{11}$B), and (ii) hydrogen in an amount of from 2 to 6.99 vol. %, based on total volume of boron trifluoride and hydrogen in such composition, wherein a reduction in beam current is less than 8%. More particularly, hydrogen may be present in any suitable amount, ranging from 2 to 6.5 vol. %, based on total volume of boron trifluoride and hydrogen in such composition, ranging from 2.5 to 6.25 vol. %, based on total volume of boron trifluoride and hydrogen in such composition, ranging from 3 to 6 vol. %, based on total volume of boron trifluoride and hydrogen in such composition, from about 4 to 6 vol. % or in an amount of 5 vol. %, based on total volume of boron trifluoride and hydrogen in said composition, it being appreciated that the specific amount, or utilized range of such amount, may be selected for specific applications to achieve a desired level of operational performance or enhancement.

In yet another aspect, the disclosure relates to a method of operating an ion implantation system, including co-flowing (a) $^{11}$B-isotopically enriched boron trifluoride from a first gas supply package, and (b) hydrogen gas from a second gas supply package, to an ion source chamber of the ion implantation system, at relative rates of the boron trifluoride and hydrogen gases to constitute a dopant source gas composition in the ion source chamber comprising (i) boron trifluoride isotopically enriched above natural abundance in boron of atomic mass 11 ($^{11}$B), and (ii) hydrogen in an amount of from 2 to 6.99 vol. %, based on total volume of boron trifluoride and hydrogen in such composition. More particularly, hydrogen may be present in any suitable amount, ranging from 2 to 6.5 vol. %, based on total volume of boron trifluoride and hydrogen in such composition, ranging from 2.5 to 6.25 vol. %, based on total volume of boron trifluoride and hydrogen in such composition, ranging from 3 to 6 vol. %, based on total volume of boron trifluoride and hydrogen in such composition, from about 4 to 6 vol. % or in an amount of 5 vol. %, based on total volume of boron trifluoride and hydrogen in said composition, it being appreciated that the specific amount, or utilized range of such amount, may be selected for specific applications to achieve a desired level of operational performance or enhancement.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings.

%) $^{11}BF_3$, (ii) co-flow of hydrogen with the substantially pure (>99.95 vol. %) $^{11}BF_3$, at a low $H_2/^{11}BF_3$ volumetric ratio, and (iii) co-flow of hydrogen with the substantially pure (>99.95 vol. %) $^{11}BF_3$, at a high $H_2/^{11}BF_3$ volumetric ratio.

Figure 5:
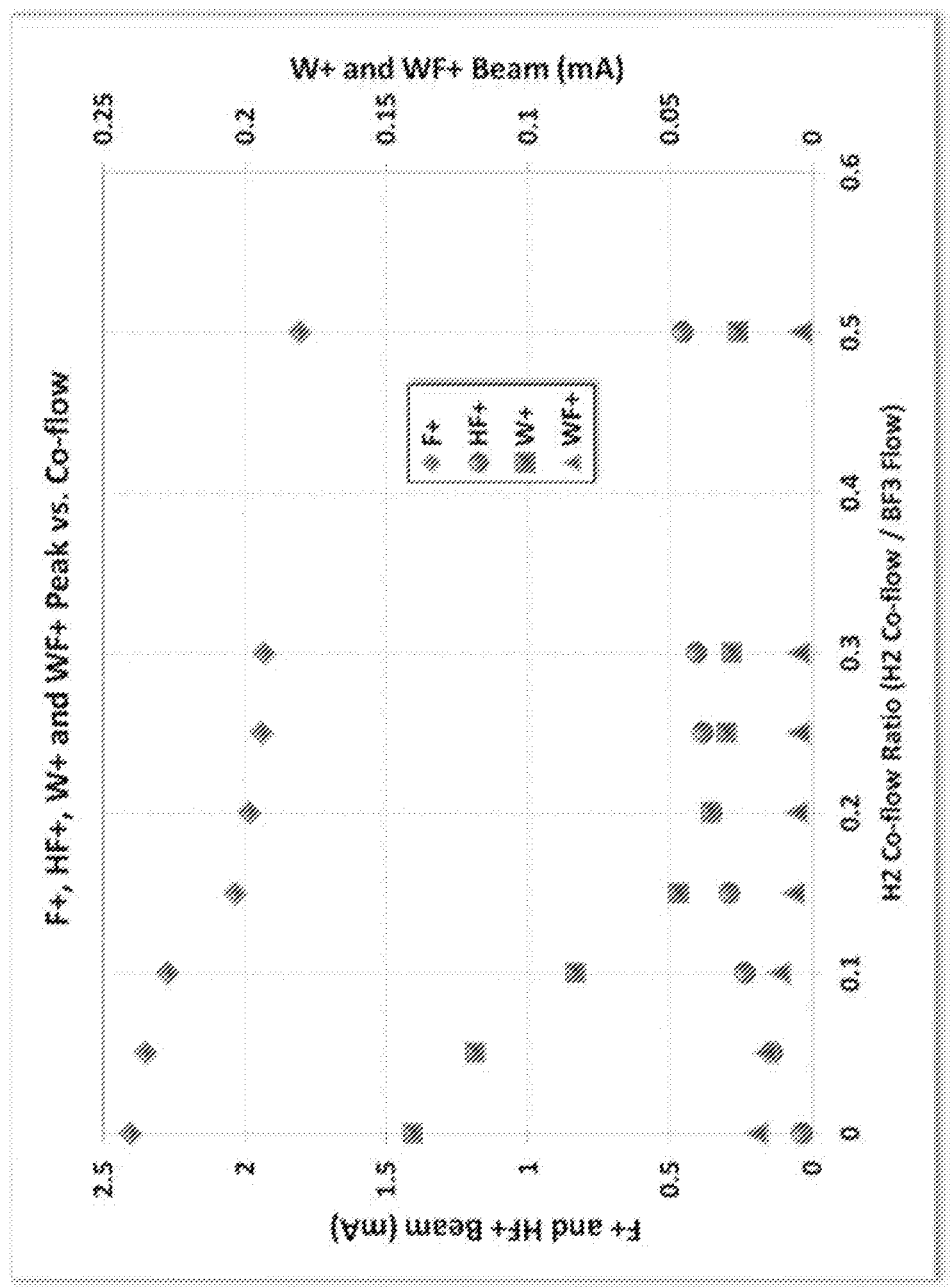

FIG. 5 is a graph of F+, HF+, W+, and WF+ beam currents, in milliamps, as a function of $H_2/^{11}BF_3$ volumetric ratio from 0 to 0.6, wherein data for the respective ion species are represented by diamond symbols (◆) for F+, circular dot symbols (●) for HF+, square symbols (■) for W+, and triangular symbols (▲) for WF+. The boron trifluoride employed to generate such data was substantially pure (>99.95 vol. %) $^{11}BF_3$.

Figure 6:
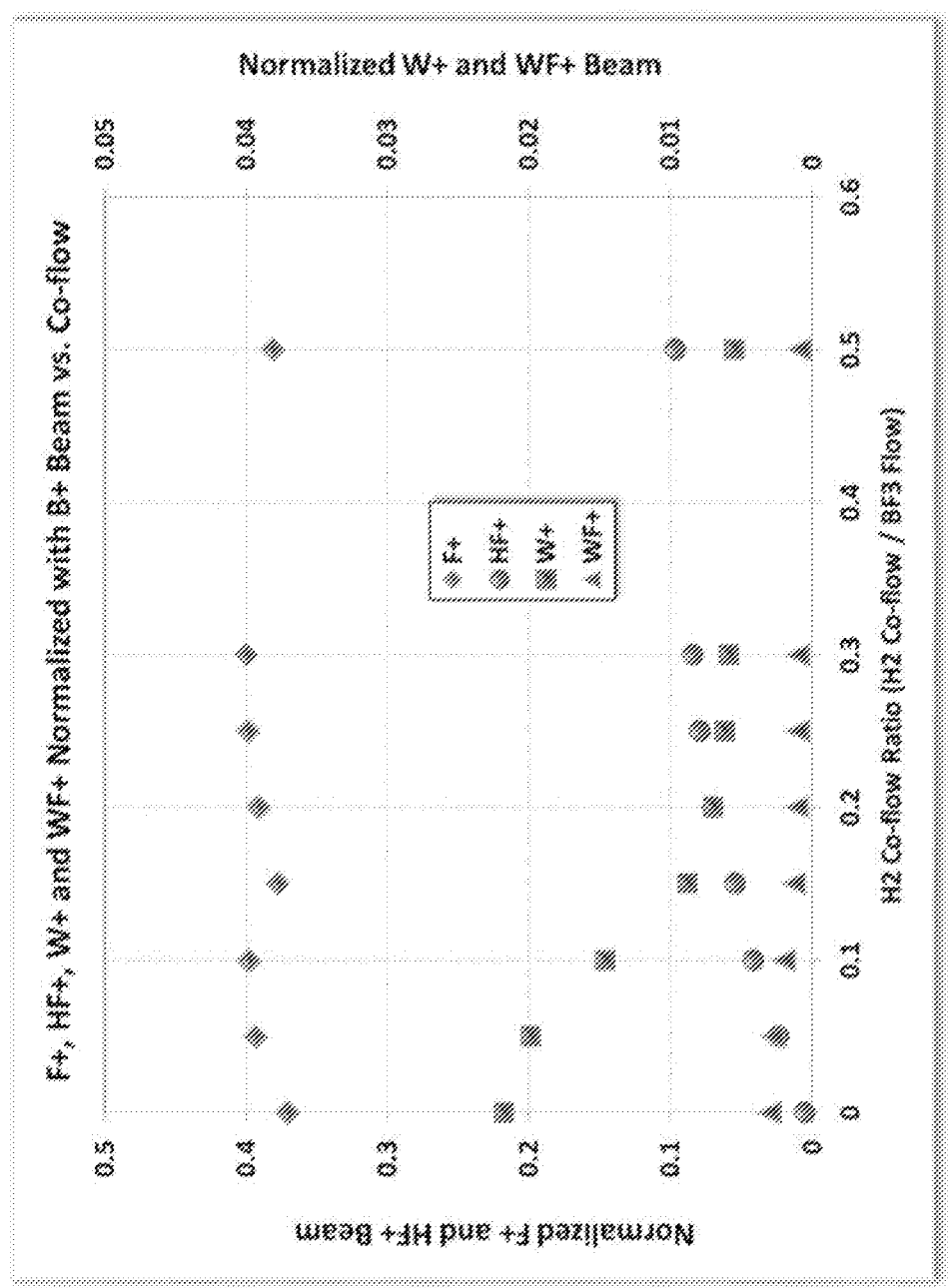

FIG. 6 is a graph of the corresponding normalized F+, HF+, W+, and WF+ beam currents, in milliamps, as a function of $H_2/^{11}BF_3$ volumetric ratio from 0 to 0.6, where x is a coefficient for the $H_2/BF_3$ ratio, wherein F+, HF+, W+, and WF+ beam currents have been normalized to B+ beam currents, with data for the respective ion species are represented by diamond symbols (▲) for F+, circular dot symbols (●) for HF+, square symbols (■) for W+, and triangular symbols (▲) for WF+.

Figure 7:
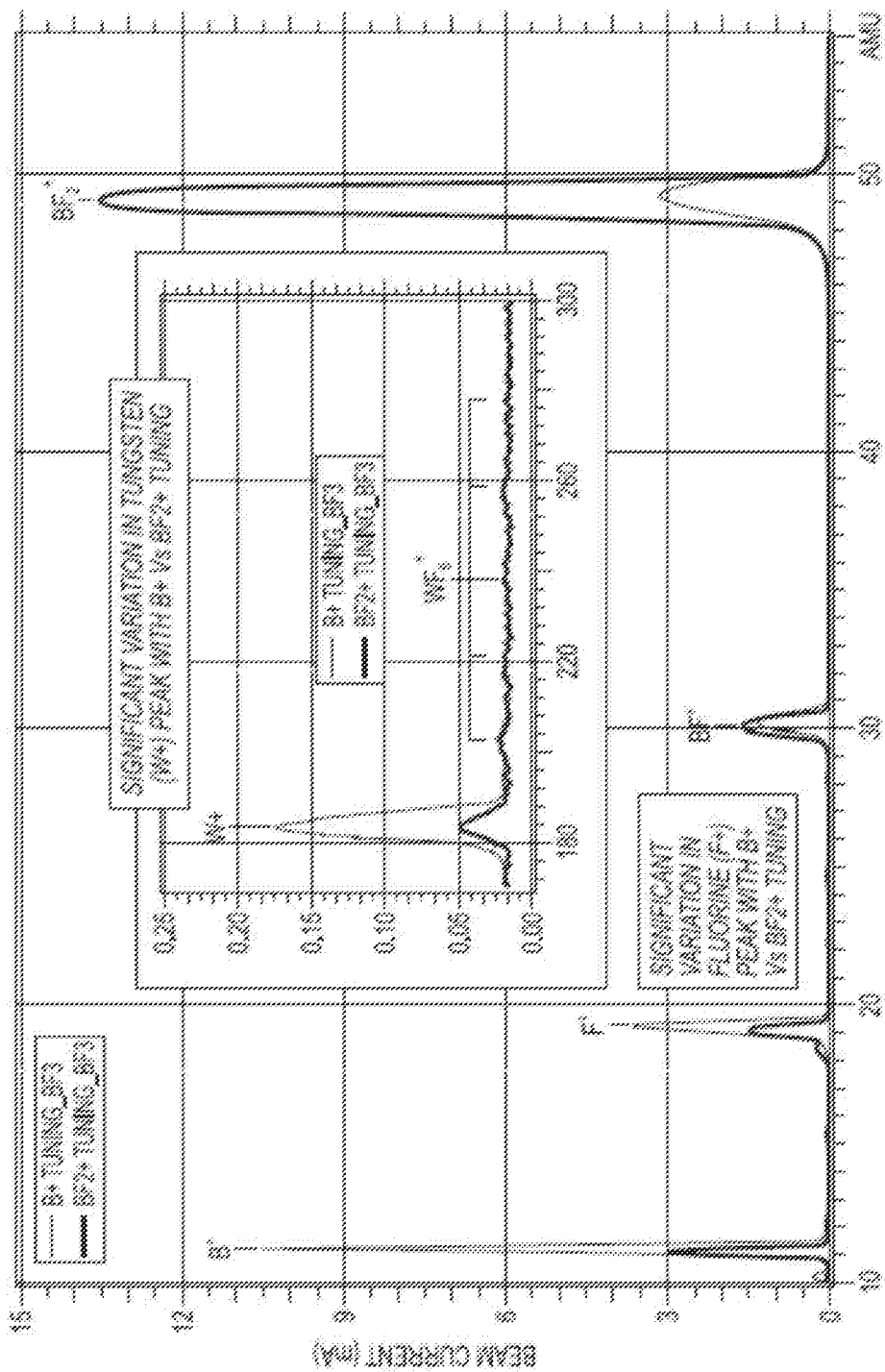

FIG. 7 is a beam spectrum comparison graph, of beam current, in milliamps, as a function of atomic mass unit (AMU) value, showing beam current values for B+, F+, BF+, and BF2+ ions, with an inset spectrum segment showing the beam current values for W+ and $WF_x+$ (x=1, 2, 3, 4, 5, and 6) ions in the range of 170-300 AMU, in which the ion implantation system was tuned for B+ ion implant species in a first run, and for $BF_2+$ ion implant species in a second run, utilizing non-hydrogenated substantially pure (>99.95 vol. %) $^{11}BF_3$ in both cases.

Figure 8:
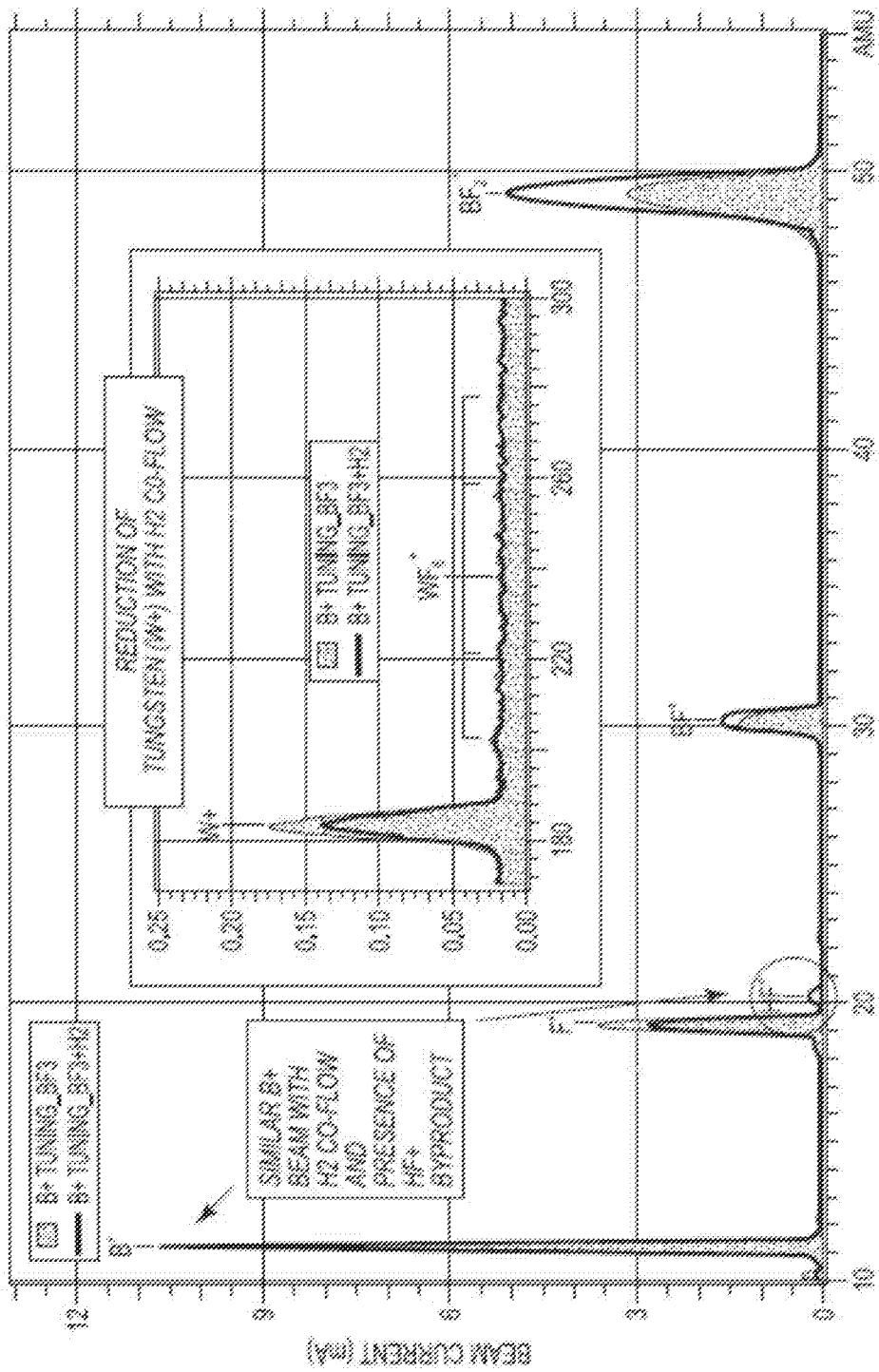

FIG. 8 is a beam spectrum comparison graph, of beam current, in milliamps, as a function of atomic mass unit (AMU) value, showing beam current values for B+, F+, BF+, and BF2+ ions, with an inset spectrum segment showing the beam current values for W+ and $WF_x+$ (x=1, 2, 3, 4, 5, and 6) ions in the range of 170-300 AMU, in which the ion implantation system was tuned for B+ ion implant species, utilizing non-hydrogenated substantially pure (>99.95 vol. %) $^{11}BF_3$ (green spectrum) in a first run, and hydrogenated substantially pure (>99.95 vol. %) $^{11}BF_3$ (red spectrum; $H_2/^{11}BF_3$ volumetric at optimized ratio of 0.05) in a second run.

Figure 9:
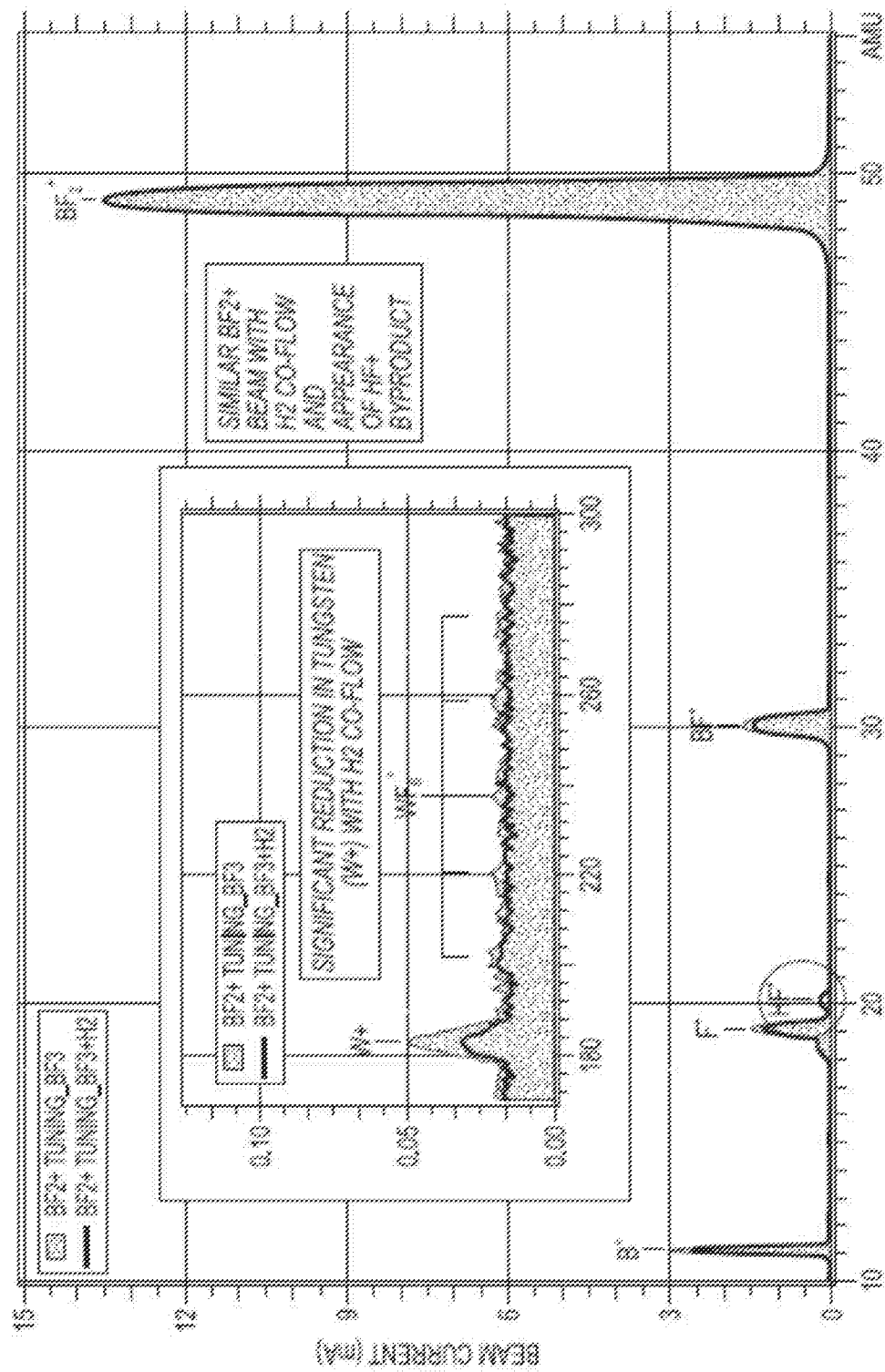

FIG. 9 is a beam spectrum comparison graph, of beam current, in milliamps, as a function of atomic mass unit (AMU) value, showing beam current values for B+, F+, BF+, and BF2+ ions, with an inset spectrum segment showing the beam current values for W+ and $WF_x+$ (x=1, 2, 3, 4, 5, and 6) ions in the range of 170-300 AMU, in which the ion implantation system was tuned for $BF_2+$ ion implant species, utilizing non-hydrogenated substantially pure (>99.95 vol. %) $^{11}BF_3$ (green spectrum) in a first run, and hydrogenated substantially pure (>99.95 vol. %) $^{11}BF_3$ (red spectrum; $H_2/^{11}BF_3$ volumetric at optimized ratio of 0.05) in a second run.

Figure 10:
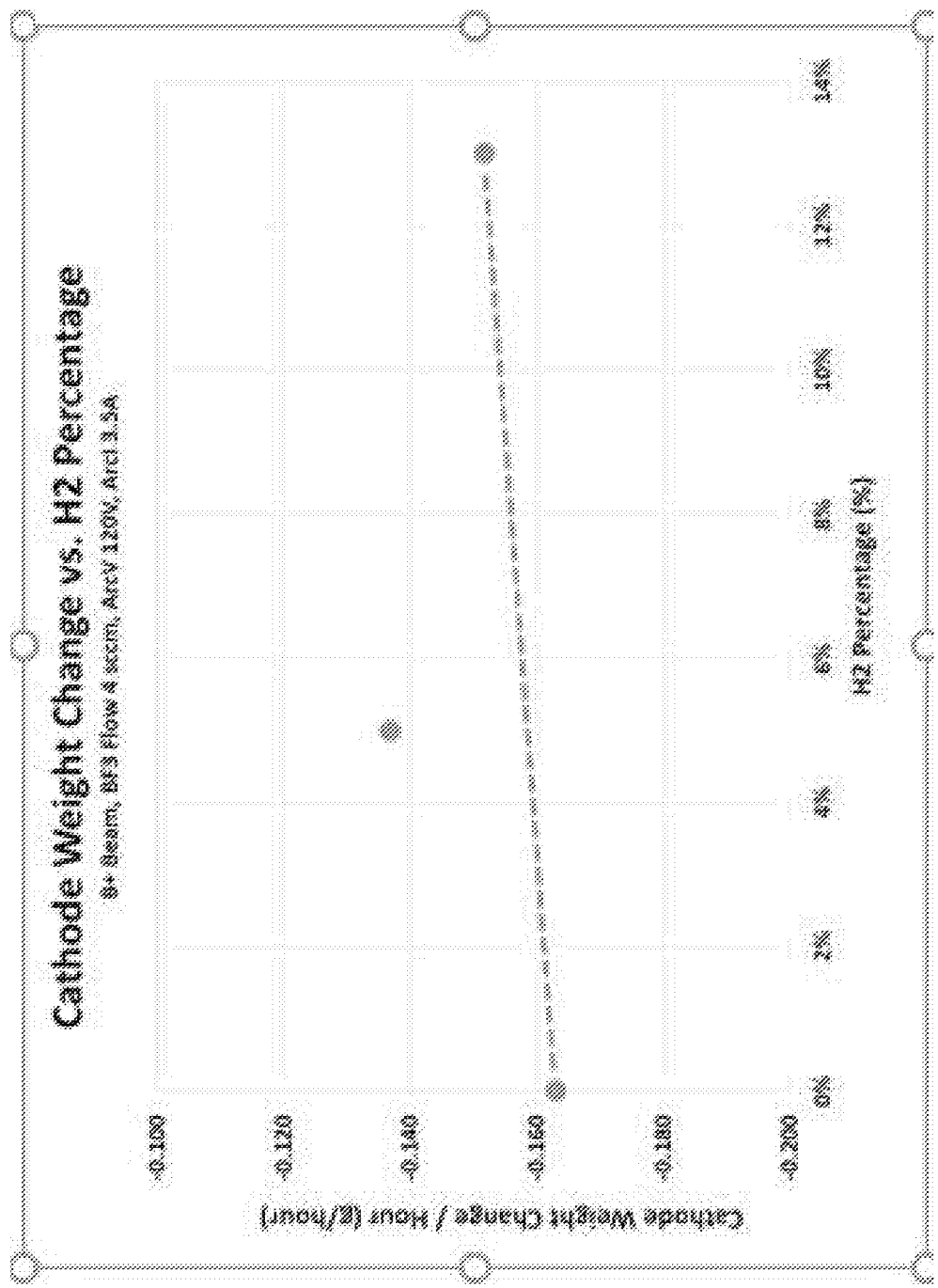

FIG. 10 is a graph showing the cathode weight change per hour plotted against the volume percentage of hydrogen gas where the implanting ion is B+.

Figure 11:
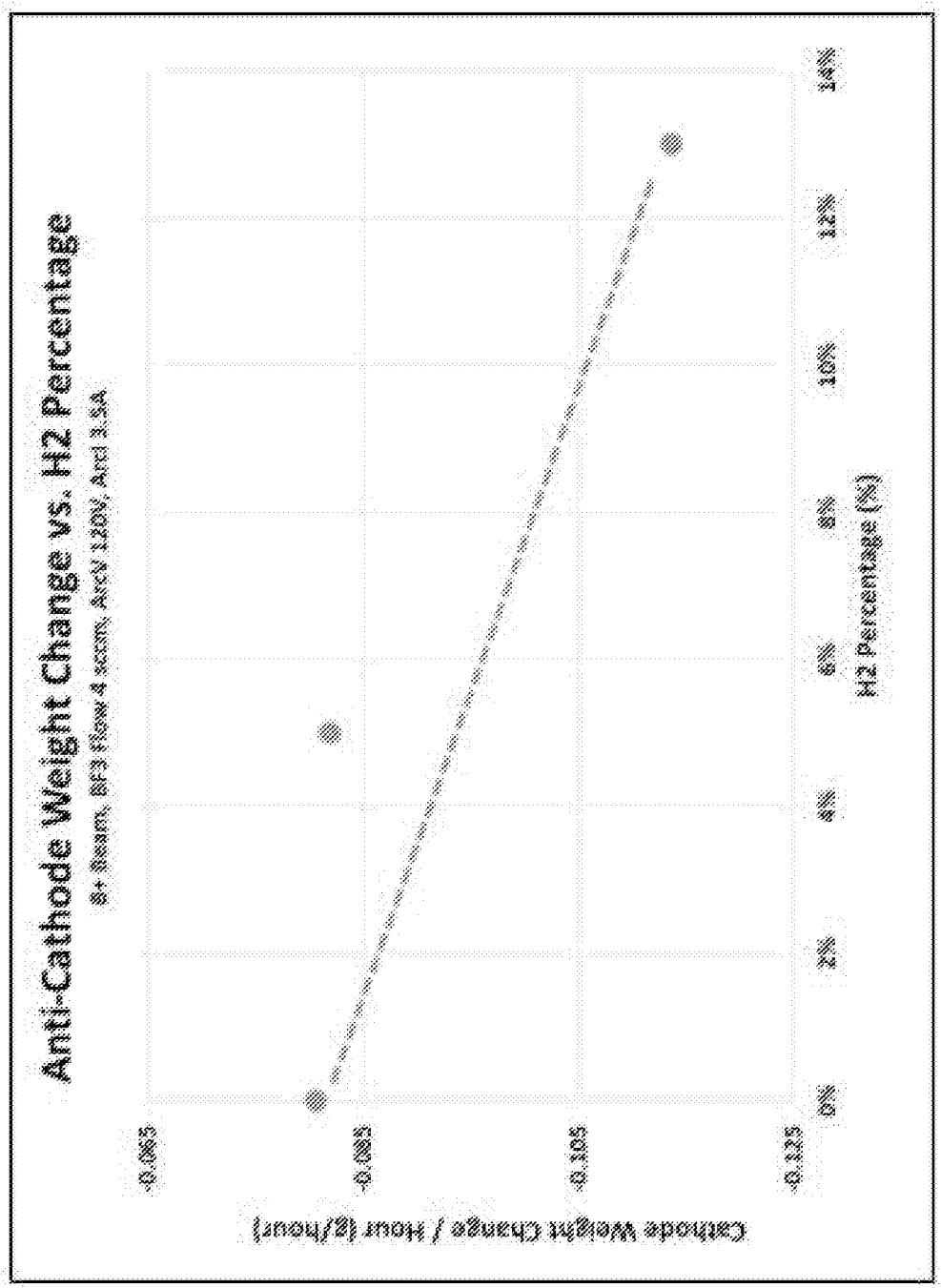

FIG. 11 is a graph showing the anti-cathode weight change per hour plotted against the volume percentage of hydrogen gas wherein the implanting ion is B+.

Figure 12:
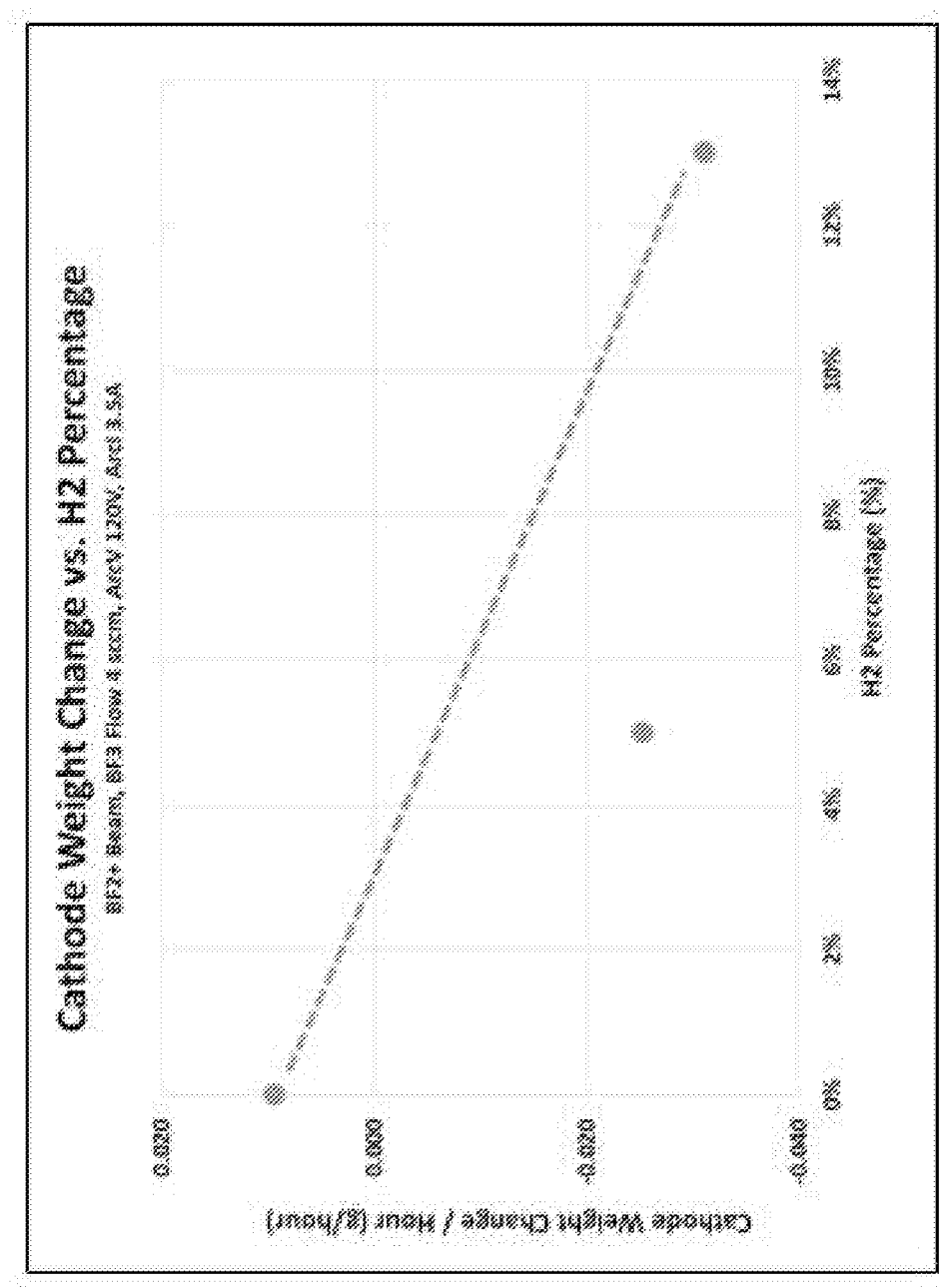

FIG. 12 is a graph showing the cathode weight change per hour plotted against the volume percentage of hydrogen gas where the implanting ion is $BF_2+$.

Figure 13:
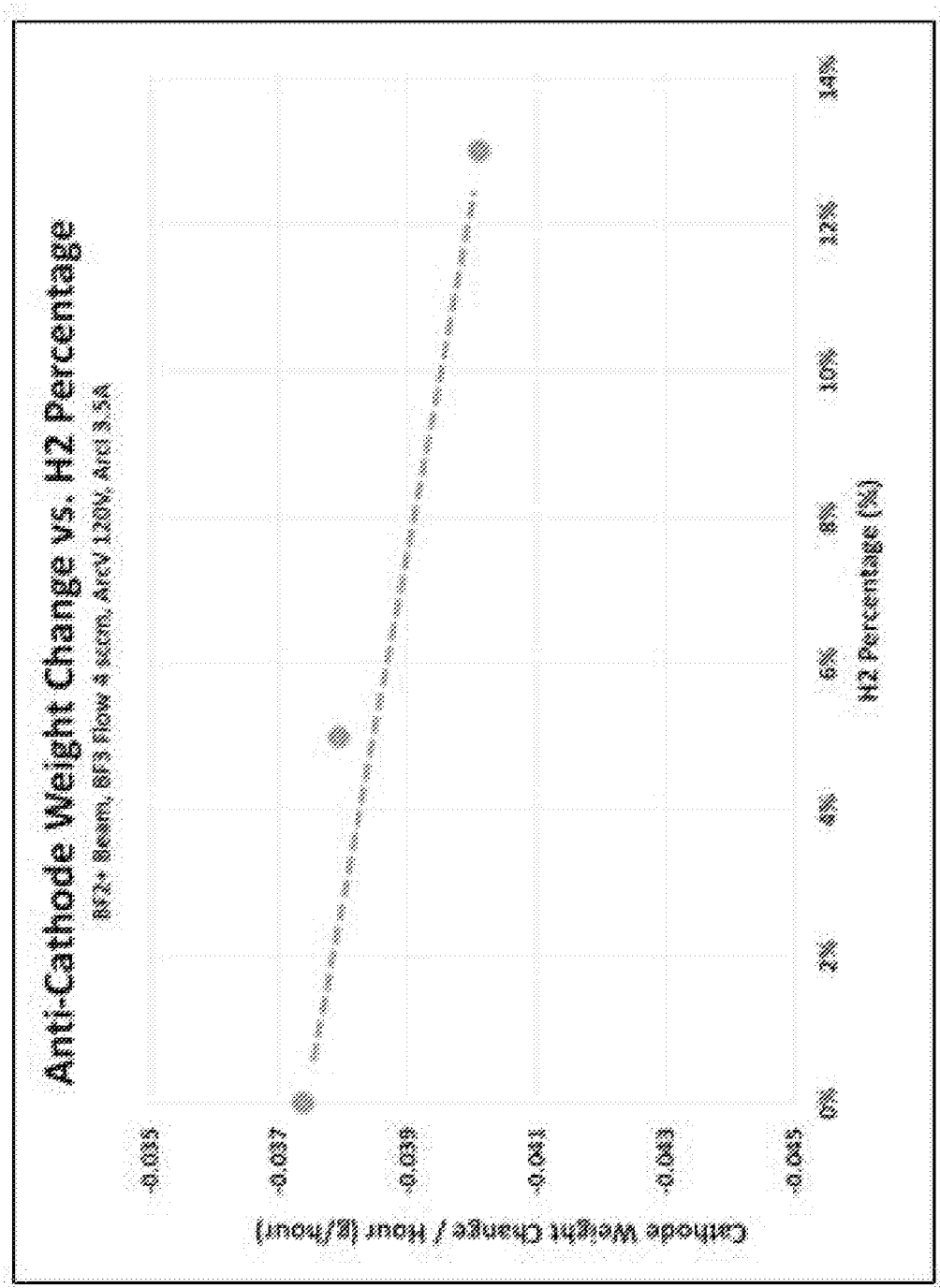

FIG. 13 is a graph showing the anti-cathode weight change per hour plotted against the volume percentage of hydrogen gas where the implanting ion is $BF_2+$.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

As used herein, and in the appended claims, the singular forms "a", "and", and "the" include plural referents unless the context clearly dictates otherwise.

As used herein, the term "pressure-regulated" in reference to fluid storage and dispensing vessels means that such vessels have at least one pressure regulator device, set pressure valve, or vacuum/pressure activated check valve disposed in an interior volume of the vessel and/or in a valve head of the vessel, with each such pressure regulator device being adapted so that it is responsive to fluid pressure in the fluid flow path immediately downstream of the pressure regulator device, and opens to enable fluid flow at a specific downstream reduced pressure condition in relation to the higher fluid pressure upstream of the pressure regulator device, and subsequent to such opening operates to maintain the pressure of fluid discharged from the pressure regulator device at a specific, or "set point," pressure level.

The present disclosure relates to a hydrogenated isotopically enriched boron trifluoride (BF3) dopant source gas composition having utility in ion implantation for generating ionic boron species for implantation in substrates, and to associated methods and apparatus, whereby high efficiency ion implantation can be carried out in the manufacture of products such as semiconductor devices, flat panel displays, and solar panels. The hydrogenated isotopically enriched boron trifluoride compositions of the present disclosure enable high boron ion beam currents to be maintained, while substantially reducing the amount of undesired beam components including tungsten and tungsten fluoride ionic species, to enable source life of the cathode to be extended, thereby enhancing the high-efficiency obtained by use of isotopically enriched boron trifluoride, and reducing the maintenance required by the ion implantation equipment, e.g., with respect to cathode re-metallization and replacement.

The hydrogenated isotopically enriched boron trifluoride compositions of the present disclosure may in various embodiments comprise, consist essentially of, or consist of the boron trifluoride and hydrogen components that are variously disclosed herein. In any of the compositions, methods, and apparatus disclosed herein, which are described as comprising components, parts, or subassemblies, it will be appreciated that other embodiments of such compositions, methods, and apparatus may be employed, as consisting or consisting essentially of such components, parts, or assemblies, as applicable.

In one embodiment, the present disclosure relates to a hydrogenated isotopically enriched boron trifluoride ($BF_3$) dopant source gas composition, including (i) boron trifluoride isotopically enriched above natural abundance in boron of atomic mass 11 ($^{11}B$), and (ii) hydrogen in an amount of from 2 to 6.99 vol. %, based on total volume of boron trifluoride and hydrogen in the composition.

In various embodiments of the hydrogenated isotopically enriched boron trifluoride ($BF_3$) dopant source gas composition of the present disclosure, the boron trifluoride isotopically enriched above natural abundance in boron of atomic mass 11 ($^{11}B$) may be isotopically enriched above an enrichment level selected from the group consisting of 80.1%, 85%, 88%, 90%, 95%, 96%, 97%, 98%, 99%, 99.5%, 99.9%, 99.99%, 99.995%, and 99.999%.

In other embodiments of the hydrogenated isotopically enriched boron trifluoride ($BF_3$) dopant source gas composition of the present disclosure, the boron trifluoride isotopically enriched above natural abundance in boron of atomic mass 11 ($^{11}B$) may be isotopically enriched at an enrichment level in a range selected from the group consisting of 81-85%, 85-90%, 90-95%, 95-99%, and 95-100%.

In various embodiments of the disclosure, the boron trifluoride isotopically enriched above natural abundance in boron of atomic mass 11 ($^{11}B$) is 100% isotopically enriched.

In one aspect, the disclosure relates to a hydrogenated isotopically enriched boron trifluoride ($BF_3$) dopant source gas composition including (i) boron trifluoride isotopically enriched above 99% in boron of atomic mass 11 ($^{11}B$), and (ii) hydrogen in an amount of 5 vol. %, based on total volume of boron trifluoride and hydrogen in said composition.

In another aspect, the disclosure relates to a hydrogenated isotopically enriched boron trifluoride ($BF_3$) dopant source gas composition consisting essentially of (i) boron trifluoride isotopically enriched above natural abundance in boron of atomic mass 11 ($^{11}B$), and (ii) hydrogen in an amount of from 2 to 6.99 vol. %, based on total volume of boron trifluoride and hydrogen in such composition.

In various embodiments of the above-described hydrogenated isotopically enriched boron trifluoride ($BF_3$) dopant source gas composition, hydrogen may be present in any suitable amount, ranging from 2 to 6.5 vol. %, based on total volume of boron trifluoride and hydrogen in such composition, ranging from 2.5 to 6.25 vol. %, based on total volume of boron trifluoride and hydrogen in such composition, ranging from 3 to 6 vol. %, based on total volume of boron trifluoride and hydrogen in such composition, from about 4 to 6 vol. % or in an amount of 5 vol. %, based on total volume of boron trifluoride and hydrogen in said composition, it being appreciated that the specific amount, or utilized range of such amount, may be selected for specific applications to achieve a desired level of operational performance or enhancement.

A further aspect of the disclosure relates to a boron dopant gas composition supply package including a gas storage and dispensing vessel holding a hydrogenated isotopically enriched boron trifluoride ($BF_3$) dopant source gas composition according to the various embodiments of the disclosure as disclosed herein.

Such supply package may be constituted, wherein the gas storage and dispensing vessel comprises an internally pressure-regulated gas storage and dispensing vessel, e.g., wherein the internally pressure-regulated gas storage and dispensing vessel has internally disposed therein a series arrangement of gas pressure regulators through which gas flows in dispensing operation of the package, as for example may be employed for dispensing of the hydrogenated isotopically enriched boron trifluoride ($BF_3$) dopant source gas composition at sub-atmospheric pressure. Alternatively, the internally pressure-regulated gas storage and dispensing vessel may be configured to deliver the dopant source gas composition at suitable pressure level in a range of from atmospheric to low superatmospheric pressure, e.g., from atmospheric pressure up to 200 psig (1.38 Megapascal (MPa)), or in a low superatmospheric pressure range, such as from 10 psig (0.069 MPa) to 200 psig (1.38 MPa), or in other embodiments, from 50 psig (0.0345 MPa) to 150 psig (1.034 MPa).

The disclosure further contemplates a method of forming a boron-implanted substrate, including ionizing a hydrogenated isotopically enriched boron trifluoride ($BF_3$) dopant source gas composition of the present disclosure, as variously described herein, to generate boron-containing ionic implant species, and implanting such boron-containing implant species in the substrate. The boron-containing ionic implant species may be of any suitable type, and may for example comprise B+, B++, B+++, $BF_2$+, $BF_2$++, or any other advantageous boron implant species.

A further aspect of the disclosure relates to a method of boron ion implantation including introducing to an ion source chamber of an ion implantation system a hydrogenated isotopically enriched boron trifluoride ($BF_3$) dopant source gas composition according to the present disclosure, as variously described herein, and ionizing such hydrogenated isotopically enriched boron trifluoride ($BF_3$) dopant source gas composition in the ion source chamber to generate boron-containing implant species for the boron ion implantation. The method may further including generating a beam of the boron-containing implant species, and directing the beam to a substrate for implantation of the boron-containing implant species therein. The method alternatively may include exposing a substrate to the boron-containing implant species, for implantation thereof in the substrate, with such exposure including any appropriate process or technique, such as plasma-assisted ion implantation, beamline implantation with mass analyzer, beamline implantation without mass analyzer, plasma immersion, etc.

The above-discussed methods may be conducted in a process for manufacture of a product selected from the group consisting of semiconductor products, flat-panel display products, and solar panel products.

The disclosure relates in a further aspect to a method of enhancing operation of an ion implantation system including providing for use in the ion implantation system a boron dopant gas composition supply package comprising a gas storage and dispensing vessel holding a hydrogenated isotopically enriched boron trifluoride ($BF_3$) dopant source gas composition according to the various embodiments as disclosed herein.

Another aspect of the disclosure relates to a method of reducing tungsten cathode erosion in a boron ion implantation system having a tungsten cathode, such method including generating boron implant species for boron ion implantation in the system by ionization of a hydrogenated isotopically enriched boron trifluoride ($BF_3$) dopant source gas composition according to the various embodiments as disclosed herein.

Yet another aspect of the disclosure relates to a method of enhancing operational performance of a boron ion implantation system including supplying for use in the boron ion implantation system a boron dopant source gas composition comprising a hydrogenated isotopically enriched boron trifluoride ($BF_3$) dopant source gas composition according to the various embodiments as disclosed herein.

In a further aspect, the disclosure relates to a method of enhancing operational performance of a boron ion implantation system including generating boron implant species in the boron ion implantation system from a boron dopant source gas composition comprising a hydrogenated isotopically enriched boron trifluoride ($BF_3$) dopant source gas composition according to the various embodiments as disclosed herein.

Accordingly, the present disclosure contemplates hydrogen/enriched boron trifluoride dopant source gas compositions for ion implantation of boron, in which the composition contains from 2 to 6.99 volume percent of hydrogen, as a compositional range in which beam current reduction is maintained at a very low level, e.g., in a range of from 0% to 8% reduction of the boron ion beam current, while the production of F+, W+, and $WF_x$+ beam components is surprisingly effectively reduced. The reduction in boron ion beam current can be determined by comparing the boron ion beam current when hydrogen is present in the dopant gas in selected amounts to the boron ion beam current in the absence of hydrogen. Accordingly, the hydrogenated isotopically enriched boron trifluoride compositions of the present disclosure enable high boron ion beam currents to be maintained, while substantially reducing the amount of undesired beam components including tungsten and tungsten fluoride ionic species, to enable source life of the cathode to be dramatically extended, thereby enhancing the high-efficiency obtained by use of isotopically enriched boron trifluoride, and dramatically reducing the maintenance required by the ion implantation equipment, e.g., with respect to cathode re-metallization and replacement.

The disclosure in a further aspect relates to a method of enhancing beam stability and ion source life of a boron doping ion implantation system including a cathode wherein the method includes introducing a boron dopant source gas composition to an ion source chamber of the boron doping ion implantation system, operating the boron doping ion implantation system to ionize the boron dopant source gas composition in the ion source chamber and generate a beam of boron dopant species that is directed to a substrate in the ion implantation system for boron doping of the substrate therein with the boron dopant species, wherein the dopant source gas composition includes (i) boron trifluoride isotopically enriched above natural abundance in boron of atomic mass 11 ($^{11}B$), and (ii) hydrogen, and hydrogen in the dopant source gas composition is present in an amount of from 2 to 6.99 vol. %, based on total volume of boron trifluoride and hydrogen in such composition, wherein a weight change (either growth or loss) of the cathode during such operating is minimized in relation to other hydrogen concentrations. In such method, the ion source chamber may include components comprising tungsten, e.g., the cathode may comprise a tungsten filament. This method will also minimize the change of bias power and filament current. It will thereby provide benefit for stable beam conditions and longer source life than would be attainable utilizing isotopically enriched boron trifluoride without the presence of hydrogen. In some embodiments, hydrogen may be present the above-described hydrogenated isotopically enriched boron trifluoride ($BF_3$) dopant source gas composition in an amount ranging from 2 to 6.5 vol. %, based on total volume of boron trifluoride and hydrogen in such composition, ranging from 2.5 to 6.25 vol. %, based on total volume of boron trifluoride and hydrogen in such composition, ranging from 3 to 6 vol. %, based on total volume of boron trifluoride and hydrogen in such composition, from about 4 to 6 vol. % or in an amount of 5 vol. %, based on total volume of boron trifluoride and hydrogen in said composition.

Figure 1:
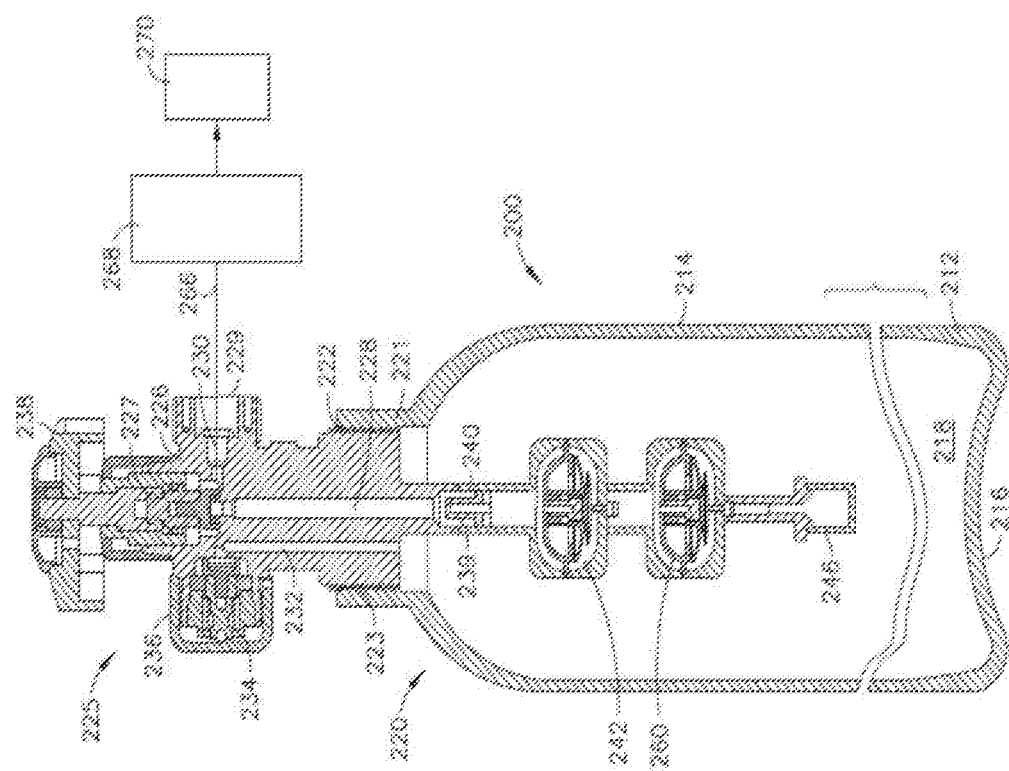
FIG. 1 is a schematic cross-sectional view of a fluid supply package including a pressure-regulated fluid storage and dispensing vessel in which the hydrogenated enriched boron trifluoride dopant source gas composition according to the various embodiments of present disclosure may be provided for storage and dispensing of the composition.

Referring now to the drawings, FIG. 1 is a schematic cross-sectional view of an exemplary fluid supply package 200 including a pressure-regulated fluid storage and dispensing vessel in which the hydrogenated enriched boron trifluoride dopant source gas composition of the present disclosure may be provided for storage and dispensing of the composition. The gas supply vessels described in U.S. Pat. Nos. 6,101,816; 6,089,027; and 6,343,476 issued to Luping Wang, et al. and commercially available from Entegris, Inc. (Billerica, Mass., USA) under the trademark VAC are one example, in which one or more gas pressure regulators may be disposed in an interior volume of a gas supply vessel, to provide for dispensing of gas at low pressure, e.g., subatmospheric pressure, for applications such as ion implantation in which low pressure source gas compositions are used to generate ionic species for ion implantation, in apparatus that is operated at corresponding low pressure.

The fluid supply package 200 includes a fluid storage and dispensing vessel 212 comprising a cylindrical sidewall 214 and a floor 216 corporately enclosing the interior volume 218 of the vessel. The side wall and floor may be formed of any suitable material of construction, e.g., metal, gas-impermeable plastic, fiber-resin composite material, etc., as appropriate to the pressure levels to be maintained in the vessel in storage and dispensing use.

At its upper end 220, the vessel features a neck 221 defining a port opening 222 bounded by the inner wall 223 of the neck 221. The inner wall 223 may be threaded or otherwise complementarily configured to mateably engage therein a valve head 225 including valve body 226 that may be complementarily threaded or otherwise configured for such engagement.

In such manner, the valve head 225 is engaged with the vessel 212 in a leak-tight manner, to hold the hydrogenated isotopically enriched boron trifluoride ($BF_3$) dopant source gas composition therein in the interior volume 218 at the desired storage conditions.

The valve head body 226 is formed with a central vertical passage 228 therein for dispensing of the hydrogenated isotopically enriched boron trifluoride ($BF_3$) dopant source gas composition from the vessel 212. The central vertical passage 228 communicates with the fluid discharge passage 230 of fluid discharge port 229, as shown.

The valve head body contains a valve element 227 that is coupled with the valve actuator 238 (hand wheel or pneumatic actuator), for selective manual or automated opening or closing of the valve. In this fashion, the valve actuator may be opened to flow gas through the central vertical passage 228 to the fluid discharge port 229, or alternatively the valve actuator may be physically closed, to terminate flow of the hydrogenated isotopically enriched boron trifluoride ($BF_3$) dopant source gas composition from the central vertical passage 228 to the fluid discharge port 229 during the dispensing operation.

The valve actuator thus can be any of various suitable types, e.g., manual actuators, pneumatic actuators, electromechanical actuators, etc., or any other suitable devices for opening and closing the valve in the valve head.

The valve element 227 is therefore arranged downstream of the regulator, so that the hydrogenated isotopically enriched boron trifluoride ($BF_3$) dopant source gas composition dispensed from the vessel flows through the regulator prior to flow through the flow control valve comprising valve element 227.

The valve head body 226 also contains a fill passage 232 formed therein to communicate at its upper end with a fill port 234. The fill port 234 is shown in the FIG. 1 drawing as capped by fill port cap 236, to protect the fill port from contamination or damage when the vessel has been filled and placed into use for the storage and dispensing of the hydrogenated isotopically enriched boron trifluoride ($BF_3$) dopant source gas composition.

The fill passage at its lower end exits the valve head body 226 at a bottom surface thereof as shown. When the fill port 234 is coupled with a source of the hydrogenated isotopically enriched boron trifluoride ($BF_3$) dopant source gas composition to be contained in the vessel, the gas can flow through the fill passage and into the interior volume 218 of the vessel 212.

Joined to the lower end of valve head body 226 is an extension tube 240, containing an upper particle filter 239 therein. Upper regulator 242 is mounted on the end of the extension tube 240. The upper regulator 242 is secured to the extension tube lower end in any suitable manner, as for example by providing internal threading in the lower end portion of the extension tube, with which the regulator 242 is threadably enagageable.

Alternatively, the upper regulator may be joined to the lower end of the extension tube by compression fittings or other leak-tight vacuum and pressure fittings, or by being bonded thereto, e.g., by welding, brazing, soldering, melt-bonding, or by suitable mechanical joining means and/or methods, etc.

The upper regulator 242 is arranged in series relationship with a lower regulator 260, as shown. For such purpose, the upper and lower regulators may be threadably engageable with one another, by complementary threading comprising threading on the lower extension portion of the upper regulator 242, and threading that is mateably engageable therewith on the upper extension portion of the lower regulator 260.

Alternatively, the upper and lower regulators may be joined to one another in any suitable manner, as for example by coupling or fitting means, by adhesive bonding, welding, brazing, soldering, etc., or the upper and lower regulators may be integrally constructed as components of a dual regulator assembly.

At its lower end, the lower regulator 260 is joined to high efficiency particle filter 246.

The high efficiency particle filter 246 serves to prevent contamination of the regulator elements and valve element 227 with particulates or other contaminating species that otherwise may be present in the hydrogenated isotopically enriched boron trifluoride ($BF_3$) dopant source gas composition flowed through the regulators and valves in the operation of the apparatus.

The embodiment shown in FIG. 1 also has a high efficiency particle filter 239 disposed in the extension tube 240, to provide further particulate removal capability, and to ensure high purity of the dispensed hydrogenated isotopically enriched boron trifluoride ($BF_3$) dopant source gas composition.

Preferably, the regulator has at least one particle filter in series flow relationship with it. Preferably, as shown in the FIG. 1 embodiment, the system includes a particle filter upstream of the regulator(s), as well as a particle filter downstream of the regulator(s), in the fluid flow path from the vessel interior volume 218 to the fluid discharge port 229.

The valve head 225 in the FIG. 1 embodiment thus provides a two-port valve head assembly—one port is the gas fill port 234, and another port is the gas discharge port 229.

The pressure regulators in the FIG. 1 embodiment are each of a type including a diaphragm element coupled with a poppet-retaining wafer. The wafer in turn is connected to the stem of a poppet element, as part of a pressure sensing assembly that precisely controls outlet fluid pressure. A slight increase in outlet pressure above set point causes the pressure sensing assembly to contract, and a slight decrease in the outlet pressure causes the pressure sensing assembly to expand. The contraction or expansion serves to translate the poppet element to provide precise pressure control. The pressure sensing assembly has a set point that is pre-established or set for the given application of the fluid storage and dispensing system.

As illustrated, a gas discharge line 266, containing a flow control device 268 therein, is coupled with the discharge port 229. By this arrangement, the flow control device in the gas discharge line is opened to flow gas from the vessel 212 to the associated ion implantation process facility 270 (e.g., in a semiconductor manufacturing plant, flat-panel display manufacturing plant, solar panel manufacturing plant, or other process facility in which an ion implantation apparatus is deployed for boron for doping of substrate particles), in the dispensing mode of the fluid storage and dispensing package 200, when hydrogenated isotopically enriched boron trifluoride ($BF_3$) dopant source gas composition from the storage and dispensing vessel is flowed through the upstream (lower) regulator 260 and then through the downstream (upper) regulator 242 to the valve head to the discharge port 229. The flow control device 268 may be of any suitable type, and in various embodiments may comprise a mass flow controller.

The hydrogenated isotopically enriched boron trifluoride ($BF_3$) dopant source gas composition dispensed in such manner will be at a pressure determined by the set point of the regulator 242.

The respective set points of the regulator 260 and the regulator 242 in the FIG. 1 embodiment may be selected or preset at any suitable values to accommodate a specific desired boron ion implantation end use application.

For example, the lower (upstream) regulator 260 may have a set point that is in a range of from about 20 psig to about 2500 psig. The upper (downstream) regulator 242 may have a set point that is above the pressure set point of the lower (upstream) regulator 260, e.g., in a range of from about 1 torr up to 2500 psig.

In one illustrative embodiment, the lower (upstream) regulator 260 has a set point pressure value that is in the range of from about 100 psig to about 1500 psig, while the upper (downstream) regulator 242 has a set point pressure value in the range of from about 100 torr to about 50 psig, wherein the lower (upstream) pressure set point is above the set point of the upper (downstream) regulator.

Although the set points of the regulators in a serial regulator assembly may be established in any suitable ratio in relation to one another, in a two-regulator assembly such as shown in FIG. 1, the upstream regulator in preferred practice advantageously has a pressure set point that is at least twice the set point value (measured in the same pressure units of measurement) of the downstream regulator.

In the FIG. 1 embodiment, the lower and upper regulators are coaxially aligned with one another to form a regulator assembly having particulate filters on either end. As a consequence of such arrangement, the hydrogenated isotopically enriched boron trifluoride ($BF_3$) dopant source gas composition dispensed from the vessel 212 is of extremely high purity.

As a further modification, the particulate filters may be coated or impregnated with a chemical adsorbent that is selective for impurity species present in the hydrogenated isotopically enriched boron trifluoride ($BF_3$) dopant source gas composition to be dispensed (e.g., decomposition products deriving from reaction or degradation of the gas in the vessel). In this manner, the hydrogenated isotopically enriched boron trifluoride ($BF_3$) dopant source gas composition flowing through the particulate filter is purified in situ along the flow path as it is being dispensed.

In one illustrative embodiment of a fluid storage and dispensing system of the type shown in FIG. 1, the vessel 212 is a 3AA 2015 DOT 2.2 liter cylinder. The high efficiency particle filter 246 is a GasShield™ PENTA™ point-of-use fluid filter, commercially available from Mott Corporation (Farmington, Conn.), having a sintered metal filtration medium in a housing of 316L VAR/electropolished stainless steel or nickel capable of greater than 99.9999999% removal of particles down to 0.003 micron diameter. The high efficiency particle filter 239 is a Mott standard 6610-¼ in-line filter, commercially available from Mott Corporation (Farmington, Conn.). The regulators are HF series Swagelok® pressure regulators, with the upper (downstream) regulator 242 having a set point pressure in the range of from 100 Torr to 100 psig, and the lower (upstream) regulator 260 having a set point pressure in the range of from 100 psig to 1500 psig, and with the set point pressure of the lower (upstream) regulator 260 being at least twice the set point pressure of the upper (downstream) regulator 242. In a specific embodiment, the upper (downstream) regulator 242 may have an inlet pressure of 100 psig and outlet pressure of 500 torr, and the lower (upstream) regulator 260 may have an inlet pressure of 1500 psig and outlet pressure of 100 psig.

Figure 2:
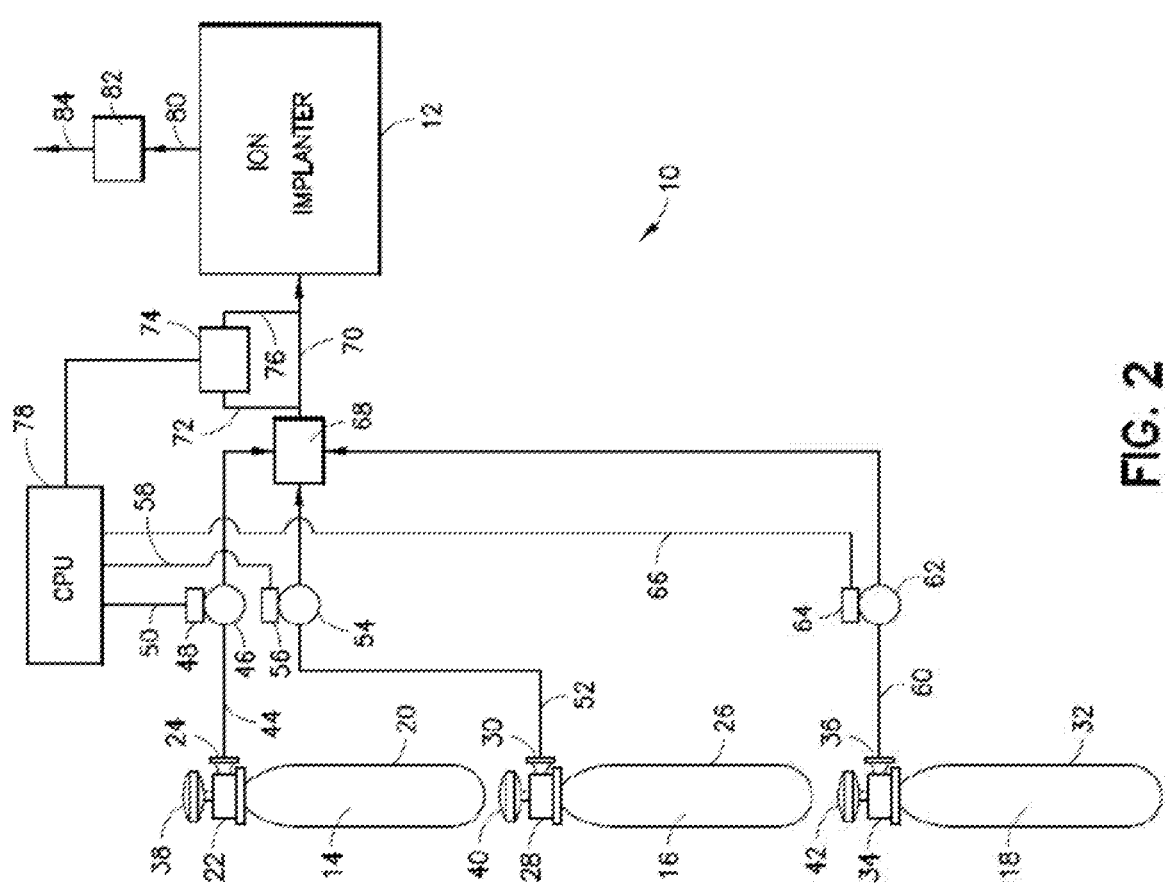
FIG. 2 is a schematic representation of an ion implantation system illustrating modes of operation according to the present disclosure in which in which a hydrogenated enriched boron trifluoride dopant source gas composition of the present disclosure is supplied to an ion implanter for implantation of boron in a substrate.

FIG. 2 is a schematic representation of an ion implantation system illustrating modes of operation according to the present disclosure in which in which a hydrogenated enriched boron trifluoride dopant source gas composition of the present disclosure is supplied to an ion implanter for implantation of boron in a substrate.

As illustrated in FIG. 2, implantation system 10 includes an ion implanter 12 that is arranged in receiving relationship to gas supply packages 14, 16 and 18, for delivering gas to the implanter.

Gas supply package 14 includes a vessel containing gas. In some cases, the vessel includes a valve head assembly 22 with a discharge port 24 joined to gas feed line 44. The valve head assembly 22 is equipped with a hand wheel 38, for manual adjustment of the valve in the valve head assembly, to translate same between fully open and fully closed positions, as desired, to effect dispensing or alternatively, closed storage, of the gas contained in vessel 20. In lieu of the provision of the hand wheel 38, the gas supply package 14 may be provided with an automatic valve actuator, e.g., a solenoid or pneumatic valve actuator, for translating the valve in the valve head assembly of the package to appropriate open or closed position.

Gases can be also contained in the gas supply packages 16 and 18, each constructed in similar manner to gas supply package 14. Gas supply package 16 comprises a vessel 26 equipped with a valve head assembly 28 to which is coupled a hand wheel 40, or alternatively an actuator for the valve in the valve head assembly. The valve head assembly 28 includes a discharge port 30 to which is joined a gas feed line 52. Similarly, gas supply package 18 includes vessel 32 equipped with a valve head assembly 34 to which is coupled hand wheel 42, or a corresponding actuator, for actuation of the valve in the valve head assembly 34. The valve head assembly 34 also includes discharge port 36 joined to gas discharge line 60.

In the arrangement shown, at least one of the gas supply packages 14, 16, and 18 may contain the hydrogenated isotopically enriched boron trifluoride ($BF_3$) dopant source gas composition of the present disclosure, for sequential supply of such gas composition to the ion implanter 12. Additionally or alternatively, one of the gas supply packages, e.g., gas supply package 14, may contain hydrogen, and another of the gas supply packages, e.g., gas supply package 16, may contain isotopically enriched boron trifluoride, to enable the hydrogenated isotopically enriched boron trifluoride ($BF_3$) dopant source gas composition to be made up at the point of use, by flowing the hydrogen and boron trifluoride components of the composition, in the respective gas feed lines 44 and 52, to the mixing chamber 68. Gas supply package 18 in such arrangement may contain additional isotopically enriched boron trifluoride, so that both gas supply packages 16 and 18 provide isotopically enriched $BF_3$, whereby when gas supply package 16 is exhausted of its inventory of boron trifluoride, the valve in the valve head of gas supply package 16 may be closed, and active dispensing of the isotopically enriched boron trifluoride switched to gas supply package 18, upon opening of the valve in the valve head of gas supply package 18. Such arrangement accommodates the relative proportions in the hydrogenated isotopically enriched boron trifluoride ($BF_3$) dopant source gas composition, in which hydrogen gas is added in a minor amount to the isotopically enriched boron trifluoride.

Accordingly, the present disclosure contemplates a dopant source gas composition supply kit, comprising (a) a boron dopant gas composition supply package, said boron dopant gas composition supply package comprising a first gas storage and dispensing vessel containing an isotopically enriched boron trifluoride ($BF_3$) dopant source gas composition, and (b) a hydrogen gas supply package, said hydrogen gas supply package comprising a second gas storage and dispensing vessel containing hydrogen gas.

As a further variation of the system shown in FIG. 2, each of gas supply packages 14 and 16 may contain the hydrogenated isotopically enriched boron trifluoride ($BF_3$) dopant source gas composition, so that upon exhaustion of an on-stream one of such packages, the other gas supply package can be switched into dispensing operation, for continuity of boron doping operation in the ion implanter, and gas supply package 18 may contain a cleaning gas. In such variation arrangement, the boron doping operation can be carried out with dispensing of the hydrogenated isotopically enriched boron trifluoride ($BF_3$) dopant source gas composition from each of the gas supply packages 14 and 16 in sequence, and after the boron doping operation has been concluded, such packages can be switched out for fresh packages of the hydrogenated isotopically enriched boron trifluoride ($BF_3$) dopant source gas composition, while the valve in gas supply package 18 is opened, to dispense cleaning gas to the flow circuitry and downstream ion implanter 12. For such purpose, the gas supply package 18 may contain any suitable cleaning gas, as for example nitrogen trifluoride, xenon difluoride, hydrogen fluoride, or other appropriate cleaning gas.

For the purpose of controlling flow from the respective gas supply packages, the respective gas feed lines 44, 52 and 60 are provided with flow control valves 46, 54 and 62 therein, respectively.

Flow control valve 46 is equipped with an automatic valve actuator 48, having signal transmission line 50 connecting the actuator to CPU 78, whereby CPU 78 can transmit control signals in signal transmission line 50 to the valve actuator to modulate the position of the valve 46, to correspondingly control the flow of gas from vessel 20 to the mixing chamber 68.

In like manner, gas discharge line 52 contains flow control valve 54 coupled with valve actuator 56 that in turn is coupled by signal transmission line 58 to the CPU 78. Correspondingly, flow control valve 62 in gas discharge line 60 is equipped with valve actuator 64 coupled by signal transmission line 66 to the CPU 78.

In this manner, the CPU can operatively control the flow of the respective gases from the corresponding vessels 20, 26 and 32.

In the event that gases are concurrently flowed (co-flowed) to mixing chamber 68, as in the case of mixing of hydrogen from one of the vessels with isotopically enriched boron trifluoride from another or others of such vessels, the resulting gas composition after mixing in mixing chamber 68 is then discharged to feed line 70 for passage to the ion implanter 12. Accordingly, the disclosure contemplates a method of operating an ion implantation system, in which $^{11}$B-isotopically enriched boron trifluoride from a first gas supply package is co-flowed to the ion source chamber of the ion implantation system with hydrogen gas from a second gas supply package, at relative rates of the boron trifluoride and hydrogen gases to constitute a dopant source gas composition in the ion source chamber comprising (i) boron trifluoride isotopically enriched above natural abundance in boron of atomic mass 11 ($^{11}$B), and (ii) hydrogen in an amount of from 2 to 6.99 vol. %, based on total volume of boron trifluoride and hydrogen in such composition.

Correspondingly, if only a single gas supply package 14, 16 or 18 is operated in dispensing mode, the corresponding hydrogenated isotopically enriched boron trifluoride ($BF_3$) dopant source gas composition then flows through the mixing chamber, as modulated by the associated flow control valve, and is passed in feed line 70 to the ion implanter.

Feed line 70 is coupled with a bypass flow loop comprised of bypass lines 72 and 76 communicating with the feed line, and with gas analyzer 74. The gas analyzer 74 thus receives a side stream from the main flow in feed line 70, and responsively generates a monitoring signal correlative of the concentration, flow rate, etc. of the gas stream and transmits a monitoring signal in the signal transmission line coupling the analyzer 74 with CPU 78. In such manner, the CPU 78 receives the monitoring signal from gas analyzer 74, processes same and responsively generates output control signals that are sent to the respective valve actuators 48, 56 and 64, or selected one or ones thereof, as appropriate, to effect the desired dispensing operation of the hydrogenated isotopically enriched boron trifluoride ($BF_3$) dopant source gas composition to the ion implanter. The gas analyzer 74 and the CPU 78, with their ancillary signal transmission lines and actuators, constitute a monitoring and control system that may be operatively employed to the land hydrogen and isotopically enriched boron trifluoride to form the hydrogenated isotopically enriched boron trifluoride ($BF_3$) dopant source gas composition containing hydrogen at the desired concentration.

The ion implanter 12 produces an effluent that is flowed in effluent line 80 to effluent treatment unit 82, which may treat the effluent by effluent treatment operations including scrubbing, catalytic oxidation, etc., to generate a treated gas effluent that is discharged from the treatment unit 82 in vent line 84, and may be passed to further treatment or other disposition.

The CPU 78 may be of any suitable type, and may variously comprise a general purpose programmable computer, a special purpose programmable computer, a programmable logic controller, microprocessor, or other computational unit that is effective for signal processing of the monitoring signal and generation of an output control signal or signals, as above described.

The CPU thus may be programmatically configured to effect a cyclic operation including concurrent flow of gases from two or all three of the sources 14, 16 and 18, or alternatively with the respective gases being flowed in sequence. Thus, any flow mode involving co-flow or mixtures of gases, or sequential gas flows, may be accommodated.

It will therefore be recognized that boron doping of a substrate in the ion implanter may be carried out in any of various manners, to utilize the hydrogenated isotopically enriched boron trifluoride ($BF_3$) dopant source gas composition as a premixed gas composition, or with point of use mixing of hydrogen and enriched boron trifluoride from separate gas supply packages, or in combination or sequence with other gas species. It will therefore be appreciated that the hydrogenated isotopically enriched boron trifluoride ($BF_3$) dopant source gas composition may be variously used along with hydride gas, fluoride gas, noble gas, oxide gas or other gas in various implementations of the ion implantation system shown in FIG. 1, or in ion implantation systems correspondingly configured for operation in accordance with the disclosure.

It will therefore be appreciated that the hydrogenated isotopically enriched boron trifluoride ($BF_3$) dopant source gas composition of the present disclosure may be provided as a premixed composition, or alternatively as made up at the point of use from respective gas supply packages of the hydrogen and boron trifluoride components of such composition, as may be desired in a given implementation of the dopant source gas composition of the present disclosure, in specific ion implantation facilities.

Figure 3:
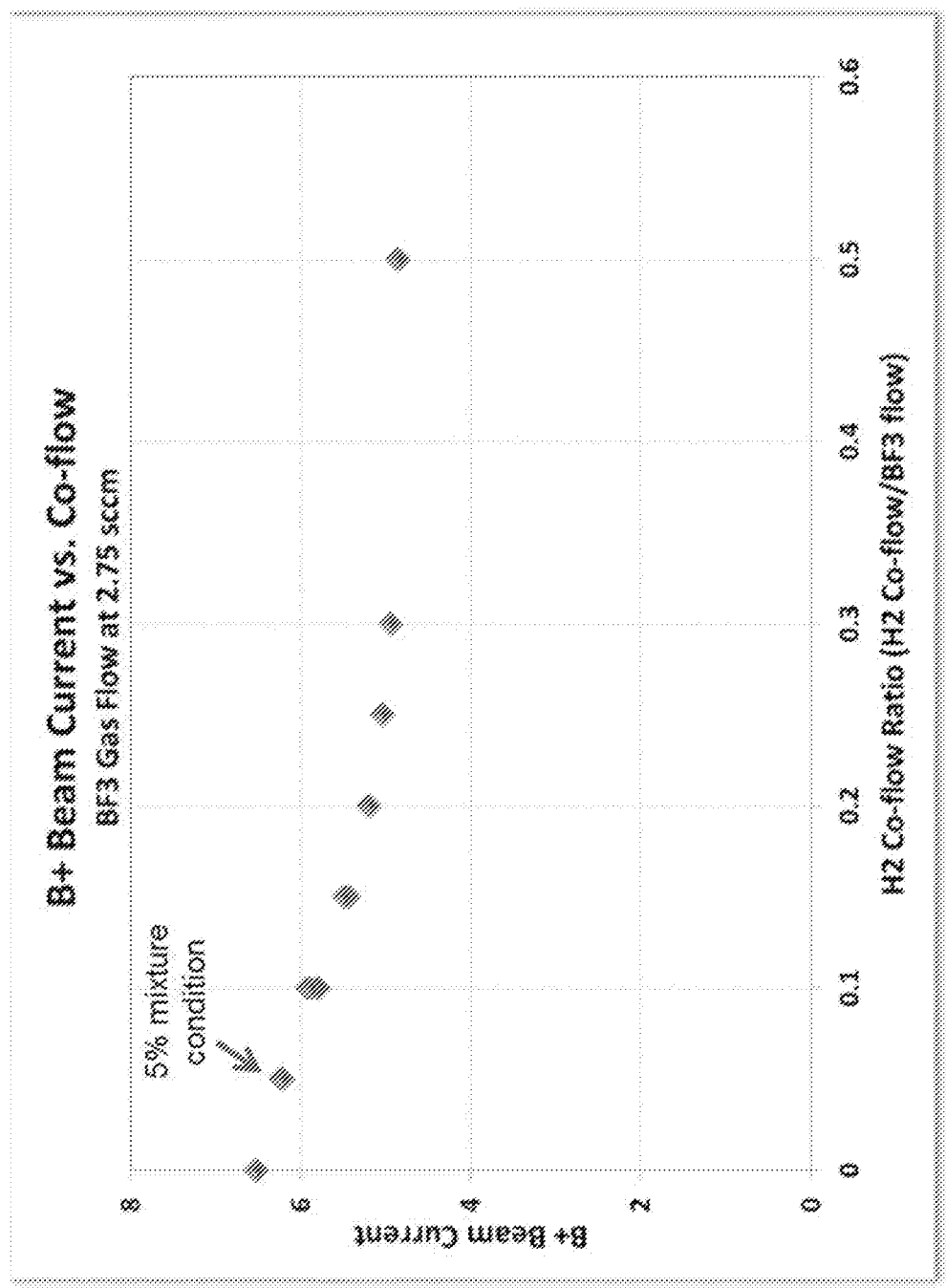
FIG. 3 is a graph of B+ beam current, as a function of hydrogen/boron trifluoride co-flow ratio (volume H$_2$/volume BF$_3$ from 0 to 0.6) flowed to an ion chamber of an ion implantation apparatus, with an isotopically enriched BF$_3$ flow rate of 2.75 standard cubic centimeters per minute (sccm), showing the beam performance of hydrogenated isotopically enriched boron trifluoride dopant source gas compositions according to the various embodiments of the present disclosure.

Referring now to FIG. 3, a graph is shown of B+ beam current, in milliamps, as a function of hydrogen/enriched boron trifluoride co-flow ratio (volume $H_2$/volume $BF_3$ from 0 to 0.6) flowed to an ion chamber of an ion implantation apparatus, with an isotopically enriched $BF_3$ flow rate of 2.75 standard cubic centimeters per minute (sccm), showing the beam performance of hydrogenated isotopically enriched boron trifluoride dopant source gas compositions of the present disclosure.

The enriched boron trifluoride gas in the hydrogenated isotopically enriched boron trifluoride dopant source gas composition used to generate the data shown in FIG. 3 was substantially pure (>99.95 vol. %) $^{11}BF_3$. The arc voltage of the ion implantation apparatus employed to generate such data was 90 V, with a source beam current of 25 mA, and an extraction voltage of 20 kV.

The data in FIG. 3 show that the B+ beam current for isotopically enriched $BF_3$ alone is approximately 6.5 mA. It has been found that at hydrogen/boron trifluoride co-flow ratio values at 0.07 and above, the beam current rapidly declines. It has been found that hydrogen/boron trifluoride co-flow ratio values below 0.02 provide inadequate hydrogen for the suppression of tungsten fluorine reaction and tungsten deposition, coating and cathode growth of tungsten in operation of the ion implantation system.

Accordingly, the present disclosure contemplates hydrogen/enriched boron trifluoride dopant source gas compositions for ion implantation of boron, in which the composition contains from about 2 to about 6.99 volume percent of hydrogen, and more particularly about 5% volume percent of hydrogen, as a compositional range in which beam current reduction is maintained at a very low level, e.g., in a range of from 0% to 8% reduction of the B+ beam current when compared to a baseline boron ion beam current, while the production of F+, W+, and $WF_x+$ beam components is effectively reduced. Accordingly, the hydrogenated isotopically enriched boron trifluoride compositions of the present disclosure enable high boron ion beam currents to be maintained, while substantially reducing the amount of undesired beam components including tungsten and tungsten fluoride ionic species, to enable source life of the cathode to be extended, thereby enhancing the high-efficiency obtained by use of isotopically enriched boron trifluoride, and reducing the maintenance required by the ion implantation equipment, e.g., with respect to cathode re-metallization and replacement.

Figure 4:
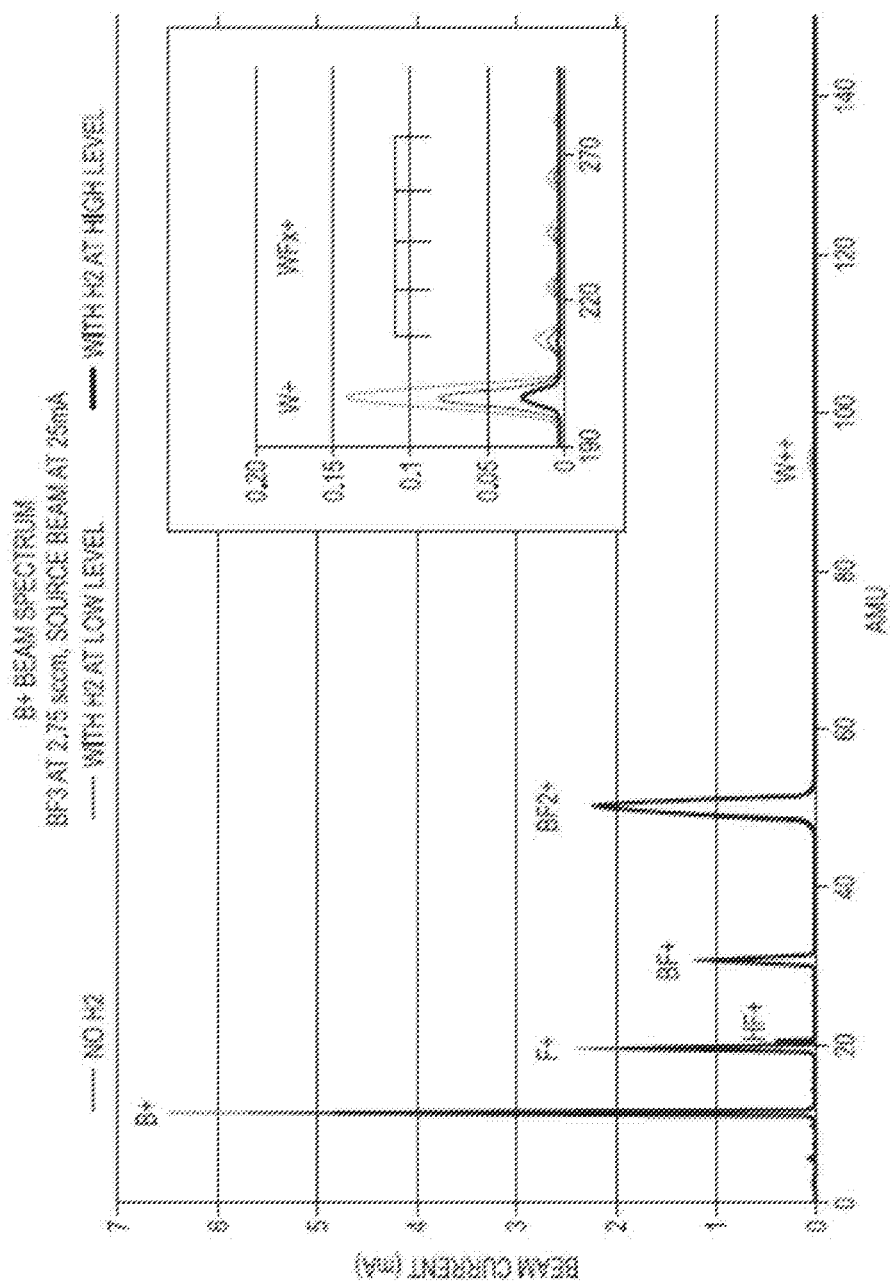
FIG. 4 is a beam spectrum comparison graph, of beam current, in milliamps, as a function of atomic mass unit (AMU) value, showing beam current values for B+, F+, HF+, BF+, BF2+, and W++ ions, with an inset spectrum segment showing the beam current values for W+ and WF$_x$+ (x=1, 2, 3, 4, 5, and 6) ions in the range of 170-300 AMU, as shown for (i) flow of only substantially pure (>99.95 vol.

FIG. 4 is a beam spectrum comparison graph, of beam current, in milliamps, as a function of atomic mass unit (AMU) value, showing beam current values for B+, F+, HF+, BF+, BF2+, and W++ ions, with an inset spectrum segment showing the beam current values for W+ and $WF_x+$ (x=1, 2, 3, 4, 5, and 6) ions in the range of 170-300 AMU, as shown for (i) flow of only substantially pure (>99.95 vol. %) $^{11}BF_3$, (ii) co-flow of hydrogen with the substantially pure (>99.95 vol. %) $^{11}BF_3$, at a low $H_2/^{11}BF_3$ volumetric ratio, and (iii) co-flow of hydrogen with the substantially pure (>99.95 vol. %) $^{11}BF_3$, at a high $H_2/^{11}BF_3$ volumetric ratio. The flow rate of the substantially pure $^{11}BF_3$ was 2.75 sccm, and the source beam current was 25 mA, with the arc voltage being 90 V, and the extraction voltage being 20 kV, in all test runs.

The data in FIG. 4 show that hydrogen co-flow is effective to significantly reduce the generation of W+ and $WF_x$ (x=1, 2, 3, 4, 5, and 6) beam spectrum components, below the levels that are generated in the absence of hydrogen.

FIG. 5 is a graph of F+, HF+, W+, and WF+ beam currents, in milliamps, as a function of $H_2/^{11}BF_3$ volumetric ratio from 0 to 0.6, wherein data for the respective ion species are represented by diamond symbols (♦) for F+, circular dot symbols (■) for HF+, square symbols (■) for W+, and triangular symbols (▲) for WF+. The boron trifluoride employed to generate such data was substantially pure (>99.95 vol. %) $^{11}BF_3$. The boron trifluoride employed to generate such data was substantially pure (>99.95 vol. %) $^{11}BF_3$.

The data in FIG. 5 show that F+, W+, and WF+ beam currents are substantially reduced by presence of hydrogen. It has been found that HF+ beam current can be maintained at a very low level in the 2 to 6.99 vol. % $H_2$, and more particularly about 5 vol. % H2 concentration range of the $H_2$/en$BF_3$ dopant source gas compositions of the present disclosure.

FIG. 6 is a graph of the corresponding normalized F+, HF+, W+, and WF+ beam currents, in milliamps, as a function of $H_2/^{11}BF_3$ volumetric ratio from 0 to 0.6, wherein F+, HF+, W+, and WF+ beam currents have been normalized to B+ beam currents, with data for the respective ion species are represented by diamond symbols (♦) for F+, circular dot symbols (●) for HF+, square symbols (■) for W+, and triangular symbols (▲) for WF+.

The dopant source gas compositions of the present disclosure therefore provide an effective balance in maintaining high beam current of the boron implant species, while at the same time reducing W+ and $WF_x+$ (x=1, 2, 3, 4, 5, and 6) beam currents and tungsten fluoride reaction. The reduction in the beam current of a selected boron implant species such as, for example, B+ or BF2+, can be determined by comparing the boron implant species beam current when hydrogen is present in the dopant gas in selected amounts to the boron implant species beam current in the absence of hydrogen. In some cases, a reduction in the boron implant species beam current can range from 0% to less than 10%; from 0% to less than 9%; from 0% to less than 8%; or from 0% to less than about 5%. This balance may help to reduce tungsten deposition, coating and cathode growth of tungsten. An appropriate balance of boron trifluoride/hydrogen mixture may also be used to prevent so-called "punch through" of the cathode due to sputtering.

The dopant source gas compositions of the present disclosure may be utilized in boron doping applications in which the ion implant system is "tuned" for selection of various boron ionic implant species. For example, in various applications, the ion implant system may be tuned for B+ doping of a substrate. In other applications, the ion implant system may be tuned for doping of BF2+ implant species in the substrate. The dopant source gas compositions of the present disclosure may be advantageously utilized in any of such ion implant systems tuned for any of a wide variety of boron ionic implant species.

It is a further surprising aspect of the present disclosure that when the ion implantation system is tuned for doping of $BF_2+$ implant species in the substrate, an even higher reduction of the tungsten mass spectral peak is achieved, in relation to the reduction observed for B+ doping of a substrate, when using the hydrogenated enriched boron trifluoride gas compositions and more particularly, the hydrogen/enriched boron trifluoride dopant source gas compositions for ion implantation of boron, in which the composition contains from about 2 to about 6.99 volume percent of hydrogen, and more particularly about 5% volume percent of hydrogen as a compositional range.

A series of tests was conducted, utilizing a commercial indirectly heated cathode ion source operated at arc power of 120 V and 3.4 A, with extraction voltage of 20 kV, and flow rate of 4 sccm of substantially pure (>99.95 vol. %) $^{11}BF_3$, with the runs involving the hydrogenated enriched boron trifluoride utilizing the same base flow rate of boron trifluoride (4 sccm) with addition of hydrogen at optimized percentage. In the beam process, the ion source was pre-warmed with argon for approximately 20 minutes, and the specific implant species beam, either B+ or $BF_2+$, was tuned by optimizing the source magnet, elected position, and analyzer magnet of the ion implantation apparatus. The resulting test beam was run for 11 hours under optimized conditions to ensure beam stability, and a mass spectrum was generated, followed by post-warming of the source with argon for approximately 15 minutes.

FIG. 7 is a beam spectrum comparison graph, of beam current, in milliamps, as a function of atomic mass unit (AMU) value, showing beam current values for B+, F+, BF+, and BF2+ ions, with an inset spectrum segment showing the beam current values for W+ and $WF_x+$ (x=1, 2, 3, 4, 5, and 6) ions in the range of 170-300 AMU, in which the ion implantation system was tuned for B+ ion implant species in a first run, and for $BF_2+$ ion implant species in a second run, utilizing non-hydrogenated substantially pure (>99.95 vol. %) $^{11}BF_3$ in both cases. As reflected in the graph, there was significant variation in the fluorine (F+) peak, and in the tungsten (W+) peak in the respective tuned equipment systems.

FIG. 8 is a beam spectrum comparison graph, of beam current, in milliamps, as a function of atomic mass unit (AMU) value, showing beam current values for B+, F+, BF+, and BF2+ ions, with an inset spectrum segment showing the beam current values for W+ and $WF_x+$ (x=1, 2, 3, 4, 5, and 6) ions in the range of 170-300 AMU, in which the ion implantation system was tuned for B+ ion implant species, utilizing non-hydrogenated substantially pure (>99.95 vol. %) $^{11}BF_3$ (green spectrum) in a first run, and hydrogenated substantially pure (>99.95 vol. %) $^{11}BF_3$ (red spectrum; $H_2/^{11}BF_3$ volumetric at optimized ratio) in a second run. As reflected in the graph, a similar B+ beam was generated in both runs, and the W+ and $WF_x+$ (x=1, 2, 3, 4, 5, and 6) peaks were reduced in the use of the hydrogenated $^{11}BF_3$ dopant gas source composition, as compared to the use of the non-hydrogenated $^{11}BF_3$ dopant gas source composition.

FIG. 9 is a beam spectrum comparison graph, of beam current, in milliamps, as a function of atomic mass unit (AMU) value, showing beam current values for B+, F+, BF+, and BF2+ ions, with an inset spectrum segment showing the beam current values for W+ and $WF_6+$ ions in the range of 170-300 AMU, in which the ion implantation system was tuned for $BF_2+$ ion implant species, utilizing non-hydrogenated substantially pure (>99.95 vol. %) $^{11}BF_3$ (green spectrum) in a first run, and hydrogenated substantially pure (>99.95 vol. %) $^{11}BF_3$ (red spectrum; $H_2/^{11}BF_3$ volumetric ratio of 0.05) in a second run. As reflected in the graph, a similar B+ beam was generated in both runs, and the W+ and $WF_6+$ peaks were significantly reduced in the use of the hydrogenated $^{11}BF_3$ dopant gas source composition, as compared to the use of the non-hydrogenated $^{11}BF_3$ dopant gas source composition.

The data for the respective runs of FIGS. 10, 11, 12 and 13 are set out in Table 1 below.

TABLE 1

| Dopant | Source Gas Mixture | H2 % | Cathode Weight Change (gram) | Cathode Weight Change/Hour (g/hour) | Anti-Cathode Weight Change (gram) | Anti-Cathode Weight Change/Hour (g/hour) |
|---|---|---|---|---|---|---|
| B+ | BF3 Only | 0% | −1.792 | −0.163 | −0.886 | −0.081 |
|  | BF3 + H2 (5%) | 5% | −1.504 | −0.137 | −0.901 | −0.082 |
|  | BF3 + H2 (13%) | 13% | −1.668 | −0.152 | −1.250 | −0.114 |
| BF2+ | BF3 Only | 0% | 0.104 | 0.009 | −0.411 | −0.037 |
|  | BF3 + H2 (5%) | 5% | −0.277 | −0.025 | −0.417 | −0.038 |
|  | BF3 + H2 (13%) | 13% | −0.341 | −0.031 | −0.441 | −0.040 |

FIG. 10 is a graph showing the cathode weight change plotted against the volume percentage of hydrogen gas where the dopant gas is B+. As evidenced by FIG. 10, the cathode weight change for $BF_3/H_2$ at 5% $H_2$ did not follow the cathode weight change trend from 0% to 13%. The weight loss of the $BF_3/5\%$ $H_2$ composition was less than either 0% or 13% of $H_2$.

FIG. 11 is a graph showing the cathode weight change plotted against the volume percentage of hydrogen gas wherein the dopant gas is B+. As shown in FIG. 11, the anti-cathode weight change for $BF_3/H_2$ at 5% $H_2$ also did not follow trend from 0% to 13%. The weight loss for $BF_3/5\%$ H2 was almost the same as 0%.

FIG. 12 is a graph showing the cathode weight change plotted against the volume percentage of hydrogen gas where the dopant gas is $BF_2+$. As evidenced by FIG. 10, the cathode weight change for $BF_3/H_2$ at 5% $H_2$ did not follow the cathode weight change trend from 0% to 13%.

FIG. 13 is a graph showing the cathode weight change plotted against the volume percentage of hydrogen gas wherein the dopant gas is $BF_2+$. As shown in FIG. 13, the anti-cathode weight change for $BF_3/5\%$ $H_2$ was more close to the 0% $H_2$ condition and slightly off the 0% to 13% trend.

From the foregoing data, it is seen that bias power was significantly impacted by hydrogen in the dopant source gas composition, with B+ dopant tuning having a larger bias power change, in relation to $BF_2+$ dopant tuning. Concerning the weight changes of the cathode and anti-cathode components, the use of a hydrogenated $^{11}BF_3$ dopant source composition in accordance with the present invention, in the ion implantation system tuned for B+ doping, produced a 7% change in cathode weight loss, as compared to the use of the non-hydrogenated $^{11}BF_3$ dopant source composition. In the ion implantation system tuned for $BF_2+$ doping, the use of a hydrogenated $^{11}BF_3$ dopant source composition in accordance with the present invention yielded a more than four-fold change in cathode weight loss.

It is a surprising and beneficial result that use of the hydrogenated isotopically enriched boron trifluoride dopant source gas compositions of the present disclosure result in less cathode weight loss than corresponding non-hydrogenated isotopically enriched boron trifluoride dopant source gas compositions, and at the same time produces less tungsten transport in the ion source. Accordingly, the dopant source gas compositions of the present disclosure achieve a substantial advance in the art.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A hydrogenated isotopically enriched boron trifluoride ($BF_3$) dopant source gas composition, said composition consisting of (i) boron trifluoride isotopically enriched above natural abundance in boron of atomic mass 11 ($^{11}B$), and (ii) hydrogen in an amount of from 4 to 6.5 vol. %, based on total volume of boron trifluoride and hydrogen in the composition.

2. The composition of claim 1, wherein the boron trifluoride isotopically enriched above natural abundance in boron of atomic mass 11 ($^{11}B$) is isotopically enriched above an enrichment level selected from the group consisting of 80.1%, 85%, 88%, 90%, 95%, 96%, 97%, 98%, 99%, 99.5%, 99.9%, 99.99%, 99.995%, and 99.999%.

3. The composition of claim 1, wherein the boron trifluoride isotopically enriched above natural abundance in boron of atomic mass 11 ($^{11}B$) is isotopically enriched above 99%.

4. The composition of claim 1, wherein hydrogen is present in an amount of from 4 to 6 vol. %, based on total volume of boron trifluoride and hydrogen in said composition.

5. The composition of claim 1, wherein hydrogen is present in an amount of 5 vol. %, based on total volume of boron trifluoride and hydrogen in said composition.

6. A hydrogenated isotopically enriched boron trifluoride ($BF_3$) dopant source gas composition, said composition consisting of (i) boron trifluoride isotopically enriched above 99% in boron of atomic mass 11 ($^{11}B$), and (ii) hydrogen in an amount of 5 vol. %, based on total volume of boron trifluoride and hydrogen in said composition.

7. A boron dopant gas composition supply package, said package comprising a gas storage and dispensing vessel holding a hydrogenated isotopically enriched boron trifluoride ($BF_3$) dopant source gas composition according to claim 1.

8. A method of boron on implantation, comprising introducing to an ion source chamber of an ion implantation system a hydrogenated isotopically enriched boron trifluoride ($BF_3$) dopant source gas composition according to claim 1, and ionizing said hydrogenated isotopically enriched boron trifluoride ($BF_3$) dopant source gas composition in the ion source chamber to generate boron-containing implant species for the boron ion implantation, wherein a beam current of the boron containing implant species is reduced less than 8% when hydrogen is present compared to a beam current of the boron containing implant species when no hydrogen is present in the ion source chamber.

9. The method of claim 8, further comprising generating a beam of said boron-containing implant species, and directing said beam to a substrate for implantation of the boron-containing implant species therein.

10. The method of claim 8, comprising exposing a substrate to the boron-containing implant species, for implantation thereof in the substrate.

11. A method of operating an ion implantation system, comprising co-flowing (a) $^{11}B$-isotopically enriched boron trifluoride from a first gas supply package, and (b) hydrogen gas from a second gas supply package, to an ion source chamber of the ion implantation system, at relative rates of the boron trifluoride and hydrogen gases to constitute a dopant source gas composition in the ion source chamber consisting of (i) boron trifluoride isotopically enriched above natural abundance in boron of atomic mass 11 ($^{11}B$), and (ii) hydrogen in an amount of from 4 to 6.5 vol. %, based on total volume of boron trifluoride and hydrogen in such composition.

12. A method comprising introducing a boron dopant source gas composition to an ion source chamber of the boron doping ion implantation system, operating the boron doping ion implantation system to ionize the boron dopant source gas composition in the ion source chamber and generate a beam of boron dopant species that is directed to a substrate in the ion implantation system for boron doping of the substrate therein with the boron dopant species, wherein the dopant source gas composition consists of (i) boron trifluoride isotopically enriched above natural abundance in boron of atomic mass 11 ($^{11}B$), and (ii) hydrogen in an amount of from 4 to 6.5 vol. %, based on the total volume of boron trifluoride and hydrogen in the composition, wherein a weight change of the cathode during said operating, in relation to other hydrogen concentrations is minimized and beam stability and ion source life is enhanced.

13. The method of claim 12, wherein the cathode comprises a tungsten filament.

14. The method of claim 12, wherein said hydrogen concentration in the dopant source gas composition concurrently minimizes change of bias power and filament current during said operating.

15. The method of claim 12, wherein the boron trifluoride is isotopically enriched above natural abundance in boron of atomic mass 11 ($^{11}B$) is isotopically enriched above 99%.

16. The method of claim 12, wherein hydrogen is present in an amount of 5 vol. %, based on total volume of boron trifluoride and hydrogen in said composition.

17. The method of claim 12, wherein a beam current of a boron ion implant species is reduced less than 8% when compared to a beam current of the boron ion implant species when no hydrogen is present in the ion source chamber.

* * * * *